United States Patent [19]

Kodama et al.

[11] Patent Number: 5,416,787
[45] Date of Patent: May 16, 1995

[54] METHOD AND APPARATUS FOR ENCODING AND DECODING CONVOLUTIONAL CODES

[75] Inventors: Tomoko Kodama, Kanagawa; Makoto Nakamura, Hyougo; Tatsunori Saito, Kanagawa, all of Japan

[73] Assignee: Kabushiki Kaisha Toshiba, Kawasaki, Japan

[21] Appl. No.: 921,507

[22] Filed: Jul. 29, 1992

[30] Foreign Application Priority Data

Jul. 30, 1991 [JP] Japan ................... 3-189852
Dec. 25, 1991 [JP] Japan ................... 3-342771
Dec. 25, 1991 [JP] Japan ................... 3-343527
Mar. 31, 1992 [JP] Japan ................... 4-074865

[51] Int. Cl.⁶ .................... G06F 11/10; H03N 13/12
[52] U.S. Cl. .................... 371/43; 371/41
[58] Field of Search .................... 371/43, 374, 44, 45, 371/46, 41

[56] References Cited

U.S. PATENT DOCUMENTS

| | | | |
|---|---|---|---|
| 3,789,360 | 1/1974 | Clark, Jr. et al. | 371/43 |
| 4,293,951 | 10/1981 | Rhodes | 371/43 |
| 5,151,904 | 9/1992 | Reiner et al. | 371/43 |
| 5,295,142 | 3/1994 | Hatakeyama | 371/43 |

OTHER PUBLICATIONS

IEEE Transactions on Communications Technology, vol. COM-19, No. 5, pp. 751-772; A. J. Viterbi; Oct. 1971: "Convolutional Codes and Their Performance in Communication Systems".

Primary Examiner—Roy N. Envall, Jr.
Assistant Examiner—Emmanuel Moise
Attorney, Agent, or Firm—Oblon, Spivak, McClelland, Maier & Neustadt

[57] ABSTRACT

A reduction of the redundancy due to the use of the convolutional codes as the error correction codes is achieved by a convolutional encoding at an identical encoding rate and a puncture process using different puncture rates for different classes of the input signals classified by the error sensitivity of each bit. A reduction of the decoding delay time without deteriorating the decoding error rate is achieved by updating the survivor path by remaining bits of the selected survivor path for each state other than the oldest bit and an additional bit indicative of the each state to which a transition is made at the present stage of decoding. A reduction of a circuit size of a Viterbi decoder is achieved by using a single RAM for memorizing a path metric and a survivor path for each state at an immediately previous stage of decoding together in each word of the memory capacity. A reduction of the decoding error rate for the data block encoded by the convolutional encoding is achieved by using the (i+N+j) bits of decoder input signals containing entire N bits of the received signals, preceded by last i bits of the received signals and followed by first j bits of the received signals.

20 Claims, 17 Drawing Sheets

METHOD AND APPARATUS FOR ENCODING AND DECODING CONVOLUTIONAL CODES

BACKGROUND OF THE INVENTION

1. Field of the Invention

The present invention relates to an error correction in encoding of convolutional codes and a decoding of convolutional codes using a Viterbi decoder for correcting errors in a digital data communication system.

2. Description of the Background Art

In recent years, in a communication system for transmitting speech signals such as an automobile telephone or a portable telephone, the direction of the progress has been pointed toward the realization of a low bit rate implementation in which the speech signals are compressed by using high efficiency encoding, in order to increase the number of channels in the available bandwidth.

In such a low bit rate implementation, the error sensitivity of each bit of the speech signal becomes greater, so that there is a need for protecting the speech signal from communication path error by using error correction codes. Here, the error sensitivity indicates an extent to which the quality of the reproduced signal is deteriorated by the error of each bit, which is different for each bit in the speech signal. In order to utilize the frequency bandwidth efficiently, it is preferable to set the error correction power of the error correction codes according to the error sensitivity of each bit.

To this end, in the conventional error correction method, the speech signals are classified into a plurality of classes according to their error sensitivities, and then encoded by using the error correction codes with different encoding rates for different classes.

A conventional apparatus for realizing such a conventional error correction encoding has a configuration as shown in FIG. 1, in which the speech signals 7 entered from an input terminal 1 are supplied to a speech encoder 2. The speech encoder 2 compresses the speech signals 7, classifies them into a bit sequence 8 having a high error sensitivity for which the deterioration of the speech quality due to the error is large, and a bit sequence 9 having a low error sensitivity for which the deterioration of the speech quality due to the error is small, and supplies these bit sequences 8 and 9 to error correction code encoders 3 and 4, respectively, which are provided in correspondence to these two classes.

The error correction code encoder 3 encodes the bit sequence 8 having a high error sensitivity by using error correction codes having a first encoding rate $r_1$, while the error correction code encoder 4 encodes the bit sequence 9 having a low error sensitivity by using error correction codes having a second encoding rate $r_2$ which is larger than the first encoding rate $r_1$. In general, the error correction power can be made higher for the smaller encoding rate.

Encoded signal sequences 10 and 11 outputted from the error correction code encoders 3 and 4, respectively, are combined into a single signal sequence 12 at a switch 5, and outputted to an output terminal 6.

In this conventional apparatus, the bit sequence 8 having a high error sensitivity can be protected better than the bit sequence 9 having a low error sensitivity because the encoding rate $r_1$ used for the bit sequence 8 is set to be smaller than the encoding rate $r_2$ used for the bit sequence 9. The frequency bandwidth can be utilized more efficiently by distributing the redundancy unevenly in such a manner.

For the error correction codes for the speech signals, the convolutional codes have been used because it is possible to realize the very powerful error correction function by carrying out the maximum likelihood decoding such as Viterbi decoding. For example, in the error correction method adopted for the digital cellular system in the United States, the convolutional codes having the encoding rate equal to $\frac{1}{2}$ are used for a plurality of bits (called the class 1 bits) having a high error sensitivity among the compressed digital speech signals. In this method, the error correction codes are not used for the bits having a low error sensitivity. In this method, if the digital speech signals are to be encoded at the lower bit rate, the absolute value of the error sensitivity of each bit will become higher, so that there is going to be a need for providing some kind of error correction codes even for the bits having a relatively lower error sensitivity among the encoded speech signals.

Now, for the speech signals in which the data to be encoded are inputted into the convolutional encoder in units of blocks, it is preferable to have a trellis of the convolutional codes terminating for each block. To this end, in order to realize the trellis whose start and end are merging into a particular state, there is a need to start the encoding in a state in which all the shift registers of the encoder are cleared, and to carry out the encoding by attaching m bits of all zero tail bits behind the data bits, where m is the memory length of the encoder, i.e., a number of shift registers in the encoder. The encoding is finished when all of the tail bits are entered into the encoder. Here, when the encoding rate of the convolutional codes is r and a number of data bits is K, the data after the encoding have a length equal to $(K+m)/r$ bits, and the effective encoding rate becomes $r \times K/(K+m)$ which is smaller than r.

For example, when $r=\frac{1}{2}$, $K=50$, and $m=6$, the data after the encoding have the length equal to 112 bits, so that the effective encoding rate becomes 50/112 which is smaller than the encoding rate $\frac{1}{2}$ of the convolutional codes. As such, the effective encoding rate becomes smaller than the encoding rate of the error correction codes in a case of the convolutional encoding of the data block, especially when the block length K is short. As a result, in such a case, the redundancy becomes larger and the frequency bandwidth utilization efficiency becomes lower.

Because of such a property of the convolutional codes, when the convolutional codes are used as the error correction codes in the conventional apparatus such as that shown in FIG. 1, there arises the problem that the redundancy required for terminating the trellis becomes large as the convolutional encoding is going to be applied to two of the data blocks having small block lengths independently. As a consequence, in a system for which the available frequency bandwidth is limited, in order to compensate this large redundancy, either the encoding rate of the convolutional codes must be increased or the number of bits in the speech signal must be made smaller, but the quality of the decoded speech signal is deteriorated in either case.

Moreover, when the classification of the speech signals according to the error sensitivity is made, the block length becomes shorter and the number of blocks becomes greater, so that the redundancy becomes even larger, and the frequency bandwidth utilization efficiency becomes even lower.

Thus, in order to utilize the frequency bandwidth efficiently, it is preferable to carry out the error correction encoding of the digital speech signals by classifying the speech signals according to the error sensitivity of each bit and then encoding these classes separately by using the error correction codes having different encoding rates. However, when the convolutional codes are used for the error correction codes, the redundancy required for terminating the trellis must be provided for each encoder, so that the frequency bandwidth utilization efficiency is rather lowered. Moreover, in the system for which the available frequency bandwidth is limited, there is a need to lower the encoding rate of the convolutional codes or to make the number of bits in the speech signals smaller in order to compensate this redundancy, so that the quality of the decoded speech signal is deteriorated.

Now, the convolutional codes and the Viterbi decoding will be described in further detail.

The convolutional code is a type of an error correction code which is widely used in a communication system such as a satellite broadcasting system and a mobile communication system, because a high encoding gain is achievable by using the convolutional codes in conjunction with the Viterbi decoding.

The Viterbi decoding is a decoding of data encoded by the convolutional encoding or the block encoding, which enable the efficient soft decision decoding.

The convolutional encoder usually includes m shift registers (m is an integer) in which case it is said to have a memory length equal to m. In this convolutional encoder, the stored contents of these shift registers at each state are collectively referred to as a state, and the state of the next stage and two bit output $C_{i,0}$ and $C_{i,1}$ are determined according to the state of the present stage and 1 bit input data $I_i$ (i=0, 1, 2, ...).

A conventional convolutional encoder for carrying out the convolutional encoding with the encoding rate $r=\frac{1}{2}$ by using two shift registers has a configuration as shown in FIG. 2. In this configuration of FIG. 2, a shift register 22 memorizes the input data for the immediately previous stage, while a shift register 23 memorizes the input data for the two times previous stage. Thus, when the input data I(t) is entered from an input terminal 21, the shift register 22 stores the data I(t−1) and the shift register 23 stores the data I(t−2).

An exclusive OR circuit (referred hereafter as an adder) 24 obtains an exclusive OR of the input data I(t) and the output data I(t−2) of the shift register 23, while an adder 25 obtains the exclusive OR of the input data I(t), the output data I(t−1) of the shift register 22, and the output data I(t−2) of the shift register 23.

The output of the adder 24 is outputted from an output terminal 26 as an encoded data $C_0(t)$, while the output of the adder 25 is outputted from an output terminal 27 as an encoded data $C_1(t)$.

Thus, the encoded data $C_0(t)$ and $C_1(t)$ can be expressed as follows.

$$C_0(t)=I(t)+I(t-2) \text{ (mod 2)} \quad (1)$$

$$C_1(t)=I(t)+I(t-1)+I(t-2) \text{ (mod 2)} \quad (2)$$

The shift registers 22 and 23 can take one of the following four states $S_0$ to $S_3$ according to their stored contents.

State $S_0$: $I(t-1)=0$, $I(t-2)=0$

State $S_1$: $I(t-1)=0$, $I(t-2)=1$

State $S_2$: $I(t-1)=1$, $I(t-2)=0$

State $S_3$: $I(t-1)=1$, $I(t-2)=1$

The encoded data $C_0$ and $C_1$ is uniquely determined by the present state and the data I to be entered next, and at the same time the next state to make a transition from the present state is also determined.

All the possible state transitions are summarized in a state transition diagram shown in FIG. 3, where each transition is indicated by an arrow between two states accompanying by the input data I and the output data $C_0$ and $C_1$ which caused that transition, in a format of $(I/C_0,C_1)$. For example, when the state at the present stage is $S_0$ and the input data $I_i=1$ is entered, the transition to the state $S_2$ is made, and the output data $(C_{i,0}, C_{i,1})=(1, 1)$ are outputted.

These state transitions can also be represented in a form of the trellis diagram shown in FIG. 4, where each one of lines 101 to 108 joining two states is called a branch, and a series of state transitions joined by the branches is called a path. As in the state transition diagram of FIG. 3, each branch is accompanying by the input data I and the output data $C_0$ and $C_1$ which caused that transition, in a format of $(I/C_0,C_1)$.

The Viterbi decoder estimates the data series with the maximum likelihood (data series having the maximum correlation with the received signals) at a high probability by selecting one survivor path which is most likely one among a plurality of paths by which the transition to each state can be realized, for every state that can be realizable in the encoder, at each decoding timing, and outputting a bit located at a position reached by tracing the selected survivor path back for a predetermined length. For the convolutional encoding with the encoding rate equal to 1/n, when the number of shift registers in the encoder is m, the constraint length $\nu$ is equal to $m+1$, and the number of states is equal to $2^m$.

The conventional Viterbi decoder has a configuration as shown in FIG. 5. In this conventional Viterbi decoder of FIG. 5, a pair of received signals $r_0$ and $r_1$, corresponding to the output data $C_0$ and $C_1$ of the convolutional encoder, for which a soft decision or a hard decision has been made at each stage, are received at an input terminal 31. These received signals $r_0$ and $r_1$ are then supplied to a branch metric calculation circuit 32, which calculates a value called a branch metric indicating the likelihood of each branch in the trellis diagram of FIG. 4 (the correlation of each branch with the received signals), for each of the branches 101 to 108. This branch metric is usually given in a form of a real number in a range of −1 to 1. Here, the higher encoding gain can be achieved by using the soft decision for the received signals $r_0$ and $r_1$.

The branch metrics calculated by the branch metric calculation circuit 32 are then supplied to an ACS (Add-Compare-Select) circuit 33. The ACS circuit 33 calculates a value called a path metric which is given by a cumulative total of the branch metrics in each path, and selects the maximum likelihood path among the paths by which the transition to each state can be made, for each of the states $S_0$ to $S_3$. For example, in order to select the maximum likelihood path by which the transition to the state $S_0$ can be made at the (t−1)-th stage in the trellis diagram shown in FIG. 4, the ACS circuit 33 compares a value obtained by adding the path metric of the state $S_0$ at the (t−2)-th stage and the branch metric of the branch 101 with a value obtained by adding the path metric of the state $S_1$ at the (t−2)-th stage and the branch metric of the branch 103, and selects the path corresponding to the larger (or smaller) one of these values.

The $2^m$ path metrics for all of the survivor paths at the previous stage used in this calculation of the path metric at the ACS circuit 33 are stored in a path metric memory 34 and read out to the ACS circuit 33, and the path metrics stored in the path metric memory 34 are updated whenever new path metrics are obtained at the ACS circuit 33.

Also, all the survivor paths at the previous stage are stored in a path memory 35, and in a case of the example described above, the survivor paths for the states $S_0$ and $S_1$ at the (t−2)-th stage are read out to the ACS circuit 33, in order to make the selection of the maximum likelihood path.

The ACS circuit 33 outputs an oldest bit in each selected survivor path to an output signal generation circuit 36, while writing the remaining bits of each selected survivor path along with one bit determined by the transition into the path memory 35, so as to update the survivor paths stored in the path memory 35. Here, the one bit to be added to the remaining bits of the survivor path indicates from which one of the two states the transition has been made. For example, in a case of the example described above, when the survivor path for the state $S_0$ at the (t−1)-th stage is obtained by the transition from the state $S_0$ at the (t−2)-th stage, the one bit to be added will be "0", whereas when the survivor path for the state $S_0$ at the (t−1)-th stage is obtained by the transition from the state $S_1$ at the (t−2)-th stage, the one bit to be added will be "1".

The output signal generation circuit 36 determines one bit output signal from $2^m$ of the oldest bits of the selected survivor paths. The obtained one bit output signal is then outputted to an output terminal 37 as the decoded signal.

Now, all the survivor paths are going to merge into one path when the trellis diagram is traced backwards for sufficient length. The merged path is theoretically guaranteed to be the maximum likelihood path, but in practice, in order to keep the circuit size and the delay time to practically reasonable values, it is preferable to use a truncation length (a length of the survivor path memorized in the path memory 35) which is as small as possible within a range in which the deterioration of the error rate can be suppressed. Usually, in order for the survivor paths to merge at a high probability, the truncation length is required to have a length which is four to five times as large as the constraint length $v$.

When all the survivor paths are merging, all of $2^m$ of the oldest bits of the selected survivor paths are equal to the same value, and this value can be taken for the one bit output signal, but in a case all of these $2^m$ oldest bits are not identical, a determination of the one bit output signal is made by using an appropriate determination procedure such as a selection of the majority among $2^m$ bits, or a selection of the bit corresponding to the larger path metric.

In such a conventional Viterbi decoder, the decoding error rate can be made smaller for the longer the survivor path, i.e., the longer truncation length, such that the data reliability can be improved. However, the decoding delay time of the decoder is given by (truncation length + constraint length − 1) so that the longer truncation length also makes the delay time longer.

In other words, the smallness of the decoding error rate and the shortness of the delay time are mutually conflicting so that they cannot be satisfied simultaneously.

Now, the path memory 35 is required to have a capacity to store $2^m$ words × (truncation length) bits, so that for the codes using the memory length m equal to 6 (i.e., the constraint length equal to 7), setting the truncation length to be four times as long as the constraint length (i.e., equal to 28), the path memory 35 is required to have a capacity of 64 words × 28 bits = 1,792 bits.

In order to implement the Viterbi decoder on a single LSI chip, the path memory 35 can be constructed from a RAM or a register. When the register is used for the path memory, it becomes possible to achieve the high speed processing but the circuit size becomes large, so that the RAM is usually used unless the high speed processing is necessary. For example, in a case of constructing the path memory of 64 words × 28 bits capacity from the internal RAM of the gate array, 10,050 gates are necessary, whereas when the same path memory is constructed from the register (7 gates), 12,544 gates are necessary.

Also, the path metric memory 34 is required to have a capacity to store $2^m$ words × (a number of digits of path metric) bits, so that for the codes using the memory length m equal to 6 (i.e., the constraint length equal to 7), setting the digits of the path metric to be eight, the path metric memory 34 is required to have a capacity of 64 words × 8 bits = 512 bits. As in the case of the path memory 35 described above, the path metric memory 34 must be constructed from a register in a case the high speed processing is necessary, but otherwise it may be constructed from the internal RAM of the LSI. Here, however, because the capacity of the path metric memory 34 is not so large, so that when the RAM is used for the path metric memory 34, the sizes of the address decoder, input buffer, and output buffer are not negligible, and there is even a case in which the circuit size can be reduced by using the register for the path metric memory 34. For example, the RAM of 64 words × 8 bits requires 4,182 gates, whereas the register of the same capacity requires only 3,584 gates.

Thus, when the path memory 35 is constructed from the RAM having 10,050 gates and the path metric memory 34 is constructed from the register having 3,584 gates, the total of the path memory 35 and the path metric memory 34 requires 13,634 gates, so that a considerable portion of the LSI must be allocated for these memories.

In addition, the number of words in the memory increases exponentially with respect to the memory length m of the encoder, so that the circuit size required for these memories becomes even larger for the codes using the longer memory length.

Thus, in the conventional Viterbi decoder, the error correction power can be made greater by using the longer memory length, but the complexity of the decoder increases exponentially with respect to the memory length. For this reason, it has been considered desirable to make the size of each component circuit in the Viterbi decoder as small as possible. In particular, in order to implement the Viterbi decoder on a single LSI chip, it has been considered desirable to realize the path memory and the path metric memory which are required to store a large amount of data in a small size.

Now, in a system in which the data are outputted in units of blocks such as packets, the trellis must be terminated for each block. Namely, in such a system, it is preferable to carry out the encoding such that the start and the end of the trellis become a particular state.

One method of encoding in which the trellis can be terminated is to set the start and the end of the trellis to the particular state in advance, as shown in FIG. 6 in which the start and the end of the trellis is set to the state $S_0$. In this case, the encoding starts from the state in which all the shift registers of the encoder are cleared, and the data are entered into the encoder with the m bits of all zero tail bits attached at the end. When the number of data bits is K and the encoding rate is ½, the length of the encoded data is going to be $2(K+m)$ bits, and the effective encoding rate is going to be $K/\{2(K+m)\}$. In particular, when K is large and m is small, the redundancy is going to be greater than twice, and there is a problem that the transmission frequency bandwidth extension rate is going to be increased. In a system having a limited frequency bandwidth extension rate, there arises a need to apply the puncture process to the particular bits in the encoded data, and this in turn deteriorates the error rate of the decoded data.

In order to cope with these problems, there is an encoding method in which the encoding is started at the state in which the first m bits of the data are already inputted into the shift registers of the encoder, and after the remaining $(K-m)$ bits of the data are inputted into the encoder, the first m bits of the data are inputted into the encoder again.

For example, the trellis diagram shown in FIG. 7 indicates the case in which the first two bits of the data are 1 and 0. The initial state in this case is $S_1$, and the final state is also going to be $S_1$. In this encoding method, 2K bits of the encoded data are outputted with respect to the input of K bits of the data, so that the encoding rate is going to be exactly ½, and there is no need to apply the puncture process even when the frequency bandwidth extension rate is limited to be up to twice.

The Viterbi decoding is actually carried out for a case of FIG. 6 and for a case of FIG. 7 as follows.

In a case of FIG. 6 in which the initial and final states are predetermined to be $S_0$, the initial and final states are also known in advance on the decoder side, so that there is a need to control the decoding such that the paths starting from the states other than $S_0$ and the paths ending at the states other than $S_0$ are not going to be selected as the survivor paths.

On the other hand, in a case of FIG. 7 in which the initial and final states are determined according to the first m bits of the data, the initial and final states are unknown on the decoder side. For this reason, there is a need to start the decoding from a state in which the path metrics of all the states at the 0-th stage are equal to each other, and it is also not possible to forcefully terminate the end of the decoding to the particular state. For these reasons, in a case of FIG. 7, there is a problem that the average error rate of the decoded data is deteriorated because of the uncertainty of the initial and final states.

SUMMARY OF THE INVENTION

It is therefore an object of the present invention to provide a method and an apparatus of error correction encoding capable of reducing the redundancy due to the use of the convolutional codes as the error correction codes.

It is another object of the present invention to provide a method and an apparatus of Viterbi decoding capable of reducing the decoding delay time without deteriorating the decoding error rate.

It is another object of the present invention to provide a Viterbi decoder with a reduced circuit size.

It is another object of the present invention to provide a decoder of convolutional codes capable of reducing the decoding error rate for the data block encoded by the convolutional encoding.

According to one aspect of the present invention there is provided an apparatus for error correction encoding using convolutional codes, comprising: means for classifying input signals containing a plurality of bits into a plurality of classes according to an error sensitivity of each bit; encoder means for applying a convolutional encoding to the input signals classified into said plurality of classes, using an identical encoding rate for all the classes, to obtain encoded signals; and puncture means for carrying out a puncture process for puncturing selected bits of the encoded signals, using different puncture rates for the encoded signals corresponding to different ones of said plurality of classes, to obtain error correction encoded output signals in which different classes of the input signals are encoded at different encoding rates according to the error sensitivity of each bit.

According to another aspect of the present invention there is provided a Viterbi decoder for decoding convolutional codes encoded by a convolutional encoder, comprising: branch metric calculation means for calculating a branch metric for each state at a present stage of decoding; path metric memory means for memorizing a path metric for each state at an immediately previous stage of decoding; path memory means for memorizing a survivor path for each state at the immediately previous stage of decoding; ACS circuit means for selecting a survivor path for each state at the present stage of decoding, by calculating the path metric for each state at the present stage of decoding from the branch metric calculated by the branch metric calculation means, the path metric memorized in the path metric memory means, and the survivor path memorized in the path memory means, the ACS circuit means outputs an oldest bit of the selected survivor path for each stage at the present stage of decoding, and updates the survivor path memorized in the path memory by remaining bits of the selected survivor path for each state at the present stage of decoding other than the oldest bit to be outputted and an additional bit indicative of said each state to which a transition is made at the present stage of decoding; and output generation means for determining a decoded output according to the oldest bit of the selected survivor path for each state &t the present stage of decoding outputted from the ACS circuit means.

According to another aspect of the present invention there is provided a Viterbi decoder for decoding convolutional codes encoded by a convolutional encoder, comprising: branch metric calculation means for calculating a branch metric for each state at a present stage of decoding; memory means, formed by a single RAM having a memory capacity of $2^m$ words $\times (L+N)$ bits, where m is a memory length of the convolutional encoder, L is a truncation length for each survivor path used in the Viterbi decoder, and N is a number of bits used for expressing each path metric, for memorizing a path metric and a survivor path for each state at an immediately previous stage of decoding together in each word of the memory capacity; ACS circuit means for selecting a survivor path for each state at the present stage of decoding, by calculating the path metric for each state at the present stage of decoding from the branch metric calculated by the branch metric calculation means, and the path metric and the survivor path memorized in the memory means, the ACS circuit means outputs an oldest bit of the selected survivor path for each stage at the present stage of decoding; and output generation means for determining a decoded output according to the oldest bit of the selected survivor path for each state at the present stage of decoding outputted from the ACS circuit.

According to another aspect of the present invention there is provided a communication system for transmitting data block containing K bits encoded by convolutional codes, comprising: a convolutional encoder for applying a convolutional encoding to the data block, in which the convolutional encoding starts from a state in which first m bits of the data block are entered in the convolutional encoder, and the convolutional encoding of remaining (K−m) bits of the data block are followed by the convolutional encoding of the first m bits of the data block, to obtain encoded signals containing N bits; memory means for memorizing the N bits of the encoded signals ($R_0, R_1, \ldots, R_{N-1}$), and outputting decoder input signals containing (i+N+j) bits arranged in an order of ($R_{N-i+h(mod\ N)}, R_{N-i+h+1(mod\ N)}, \ldots, R_{N-1+h(mod\ N)}, R_{h(mod\ N)}, R_{h+1(mod\ N)}, \ldots, R_{N-1+h(mod\ N)}, R_{h(mod\ N)}, R_{h+1(mod\ N)}, \ldots, R_{h+j-1(mod\ N)}$), where i is a positive integer, j is a non-negative integer, and h is a positive integer; and a Viterbi decoder for decoding the (i+N+j) bits of the decoder input signals in said order in which the decoder input signals are outputted From the memory means.

According to another aspect of the present invention there is provided a method of transmitting data block containing K bits encoded by convolutional codes, comprising the steps of: (a) applying the convolutional encoding to the data block, in which the convolutional encoding starts from a state in which first m bits of the data block are entered in a convolutional encoder, and the convolutional encoding of remaining (K−m) bits of the data block are followed by the convolutional encoding of the first m bits of the data block, to obtain encoded signals containing N bits; (b) memorizing the N bits of the encoded signals ($R_0, R_1, \ldots, R_{N-1}$), and outputting decoder input signals containing (i+N+j) bits arranged in an order of ($R_{N-i+h(mod\ N)}, R_{N-i+h+1(mod\ N)}, \ldots, R_{N-1+h(mod\ N)}, R_{h(mod\ N)}, R_{h+1(mod\ N)}, \ldots, R_{N-1+h(mod\ N)}, R_{h(mod\ N)}, R_{h+1(mod\ N)}, \ldots, R_{h+j-1(mod\ N)}$), where i is a positive integer, j is a non-negative integer, and h is a positive integer; and (c) decoding the (i+N+j) bits of the decoder input signals in said order in which the decoder input signals are outputted, by a Viterbi decoder.

According to another aspect of the present invention there is provided a method of decoding data encoded by a convolutional encoder having a memory length equal to m and capable of taking $2^m$ states; comprising the steps of: (a) memorizing the data; (b) calculating a likelihood for each of the $2^m$ states of the convolutional encoder to be an initial state, from at least a part of the data memorized at the step (a); and (c) decoding the data memorized at the step (a) by using the likelihood for each state to be the initial state calculated at the step (b), by a Viterbi decoder.

According to another aspect of the present invention there is provided an apparatus for decoding data encoded by a convolutional encoder capable of taking M states; comprising: Viterbi decoding means for decoding the data more than once with more than one different settings of an initial state of a trellis to be different one of the M states of the convolutional encoder, to obtain a plurality of decoded outputs; and output determining means for selecting one of said plurality of decoded outputs of the Viterbi decoding unit.

Other features and advantages of the present invention will become apparent from the following description taken in conjunction with the accompanying drawings.

DETAILED DESCRIPTION OF THE PREFERRED EMBODIMENTS

Figure 8:
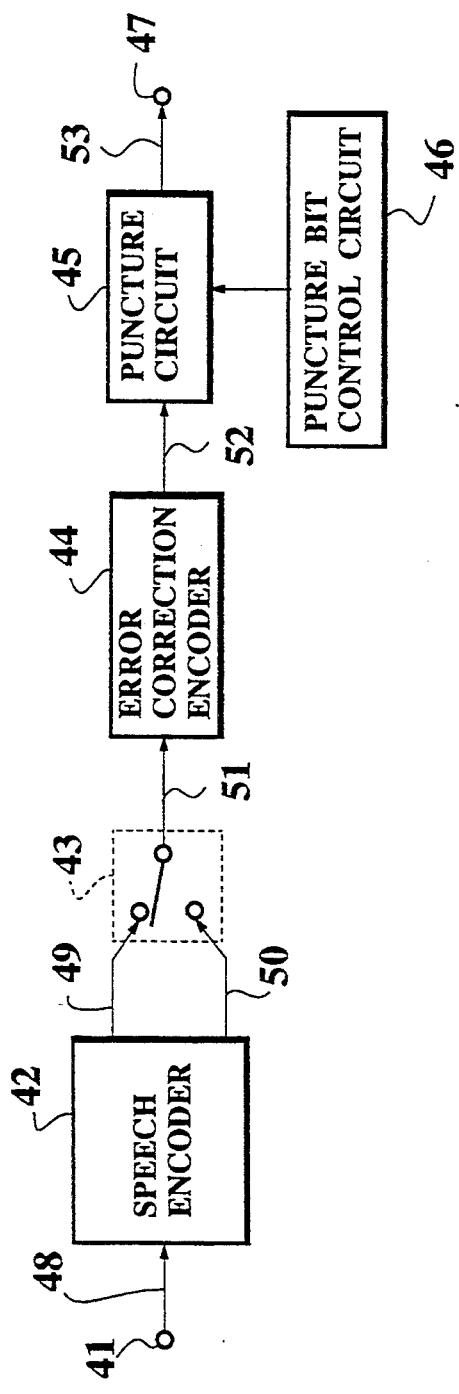
FIG. 8 is a schematic block diagram of an apparatus for carrying out one embodiment of a method of encoding the convolutional codes according to the present invention.

Referring now to FIG. 8, one embodiment of an encoding of the convolutional codes as the error correction codes for the speech signals according to the present invention will be described in detail.

In this embodiment, an apparatus for carrying out the error correction encoding has a configuration shown in FIG. 8, which comprises: an input terminal 41 for receiving the speech signals 48; a speech encoder 42 for applying a compression encoding to the speech signals 48 and classifying them into two classes of digital speech signals including $K_1$ bits of class 1 digital speech signals 49 $\{I_1, I_2, \ldots, I_{k1}\}$ having a high error sensitivity and $K_2$ bits of class 2 digital speech signals 50 $\{I_{K1+1}, I_{K1+2}, \ldots, I_{K1+K2}\}$ having a low error sensitivity, a switch 43 for producing an ordered sequence of $K_1+K_2$ bits of continuous digital speech signals 51 $\{I_1, I_2, \ldots, I_{K1}, I_{K1+1}, I_{K1+2}, \ldots, I_{K1+K2}\}$ from the class 1 digital speech signals 49 and the class 2 digital speech signals 50; an error correction encoder 44 with a memory length equal to m, for applying a convolutional encoding to the continuous digital speech signals 51 with m bits of predetermined tail bits added at the end at a constant encoding rate; a puncture circuit 45 for applying a puncture process to be described below to the output of the error correction encoder 44; a puncture bit control circuit 46 for controlling positions of bits to be punctured by the puncture circuit 45 in the puncture process; and an output terminal 47 for outputting the punctured final output signals 53.

The error correction encoder 44 outputs the 2 bit output signals $C_{j,0}$ and $C_{j,1}$ with respect to every input signal $I_j$, where $j=1, 2, \ldots, K_1+K_2+m$ and $I_j=0$ for $j \geq K_1+K_2+1$.

Figure 9:
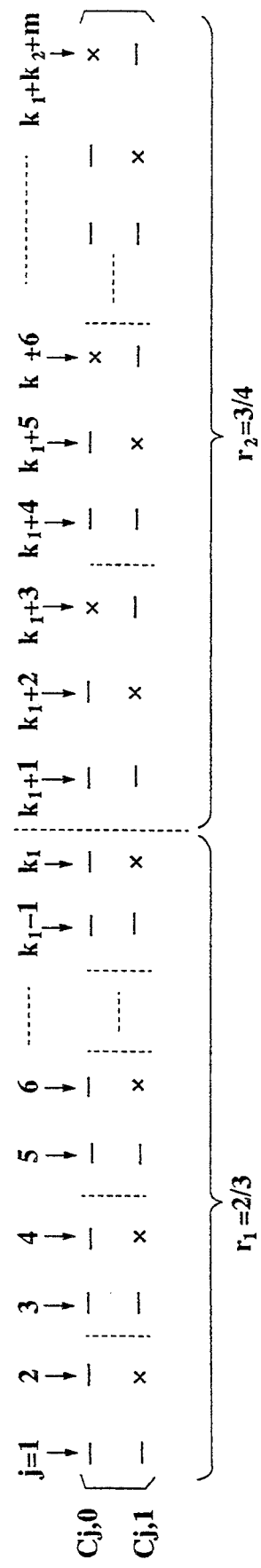
FIG. 9 is a diagram for explaining the puncture process to be applied in the method of encoding carried out by the apparatus of FIG. 8.

Under the control of the puncture bit control circuit 46, the puncture circuit 45 punctures such 2 bit output signals $C_{j,0}$ and $C_{j,1}$ of the error correction encoder 44 in a puncture pattern shown in FIG. 9, where a bit position labelled "x" is punctured while a bit position labelled "-" is not punctured, such that the final encoding rate for the final output signals 53 corresponding to the class 1 digital speech signals 49 is the first encoding rate $r_1=\frac{2}{3}$, whereas the final encoding rate for the final output signals 53 corresponding to the class 2 digital speech signals 50 is the second encoding rate $r_2=\frac{8}{12}$. Thus, the puncture rates is changed at a border between the class 1 digital speech signals 49 and the class 2 digital speech signals 50 in the ordered sequence produced at the switch 43.

In this embodiment, when a number of bits of the class 1 digital speech signals 49 is $K_1=30$, a number of bits of the class 2 digital speech signals 50 is $K_2=30$, the memory length of the error correction encoder 44 is $m=6$, the first encoding rate is $r_1=\frac{2}{3}$, and the second encoding rate is $r_2=\frac{3}{4}$, a number of bits of the final output signals 53 after the error correction encoding will be $30 \times (3/2)+(30+6) \times (4/3)=93$ bits. On the other hand, in a conventional error correction method using the different encoding rates for different classes of the speech signals separately, a number of bits of the output signals after the error correction encoding will be $(30+6) \times (3/2)+(30+6) \times (4/3)=102$ bits, for the same conditions as specified above. Thus, according to this embodiment, the redundancy in the error correction encoded speech signals can be made smaller compared with the conventional error correction method when the same encoding rates are used.

Figure 10:
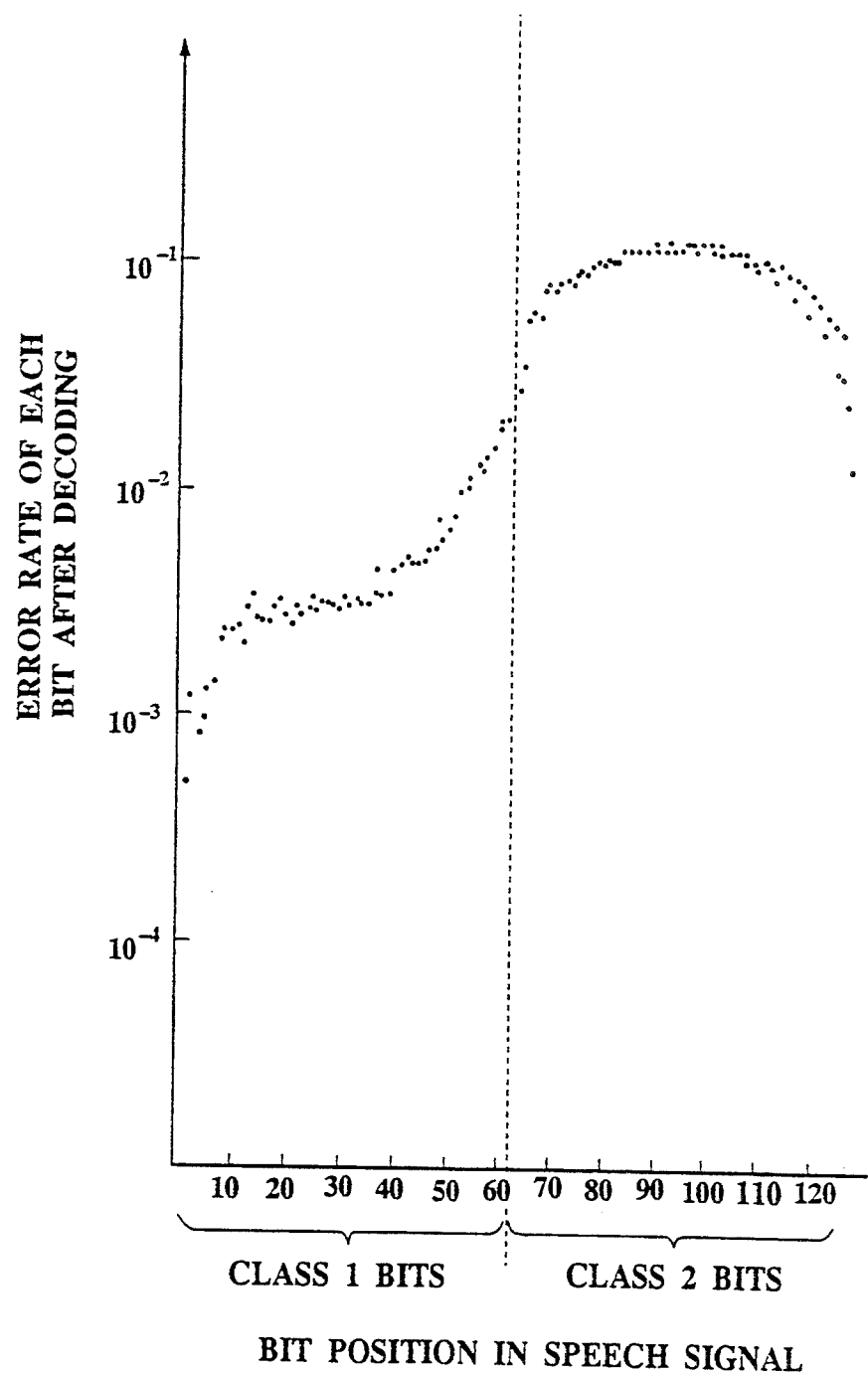
FIG. 10 is a graph of an error rate for each bit after decoding versus bit position in speech signal, for showing the effect of the method of encoding carried out by the apparatus of FIG. 8.

The error rates for all the bits of the speech signals after the decoding for the error correction encoded speech signals obtained by this embodiment are shown in a graph of FIG. 10, which is obtained by using the conditions of a number of bits of the class 1 digital speech signals 49 is $K_1=62$, a number of bits of the class 2 digital speech signals 50 is $K_2=64$, the memory length of the error correction encoder 44 is $m=6$, the first encoding rate $r_1$ is approximately 0.54, and the second encoding rate $r_2$ is approximately 0.75. As can be seen in FIG. 10, the error rates for the class 1 digital speech signals 49 are in a vicinity of 0.003, whereas the error rates for the class 2 digital speech signals 50 are in a vicinity of 0.1, so that there is a clear difference in the error correction power among the bits having different error sensitivities.

In FIG. 10, the relatively low error rates for the first few bits and the last few bits are due to the fact that the start and the end of the trellis are terminated to the particular state. Also, at the border of the class 1 bits and the class 2 bits, the error rates change gradually because the Viterbi decoder to be used in decoding these speech signals carries out the Viterbi decoding in which the decoded bit is determined by going back to the past for the predetermined truncation length (equal to 60 bits in this case) according to the cumulative likelihood index called the path metrics which are gradually updated in the course of the decoding. Due to this property of the Viterbi decoder, the use of the discretely different puncture rates for the different classes of the speech signals in this embodiment does not cause the abrupt change in the decoding error rates.

It is to be noted that the above described embodiment may be modified by using the classification with more than three classes among the speech signals, instead of just two classes as in the above. The redundancy can be improved more by using more classes. Here, in a case of using the classification with more than three classes, the differences in the error rates after the decoding among the different classes can be provided more effectively by arranging the classes of the speech signals in either an ascending order or a descending order of the error sensitivities of these classes of the speech signals, such that the puncture rates used in encoding the different classes either increases or decreases monotonically. This is basically due to the above described fact that the use of the discretely different puncture rates for the different classes of the speech signals in this embodiment does not cause the abrupt change in the decoding error rates, so that bits in a vicinity of the border between two different classes are affected by the puncture rates used for the adjacent class. For this reason, it is preferable to change the puncture rates monotonically.

It is also to be noted that any puncture pattern other than that shown in FIG. 9 may be utilized according to the need. In particular, the final encoding rates such as ⅖ or ½ can be realized by modifying the embodiment described above in such a manner that the encoding rate of the error correction encoder 44 is set to be lower (such as ¼ for example), and some of the the output signal sequences are deleted entirely in the puncture process by the puncture circuit 45.

Thus, according to this embodiment, it is possible to provide a method and an apparatus for error correction encoding capable of reducing the redundancy due to the use of the convolutional codes as the error correction codes, compared with the conventional error correction encoding method using the convolutional encoding at the same encoding rate, because there is no need to terminate the trellis for each class separately in this embodiment.

Moreover, in this embodiment, very flexible setting of the encoding rates for different classes of the speech signals can be realized by setting the puncture rates for the different classes of the speech signals appropriately.

Figure 11:
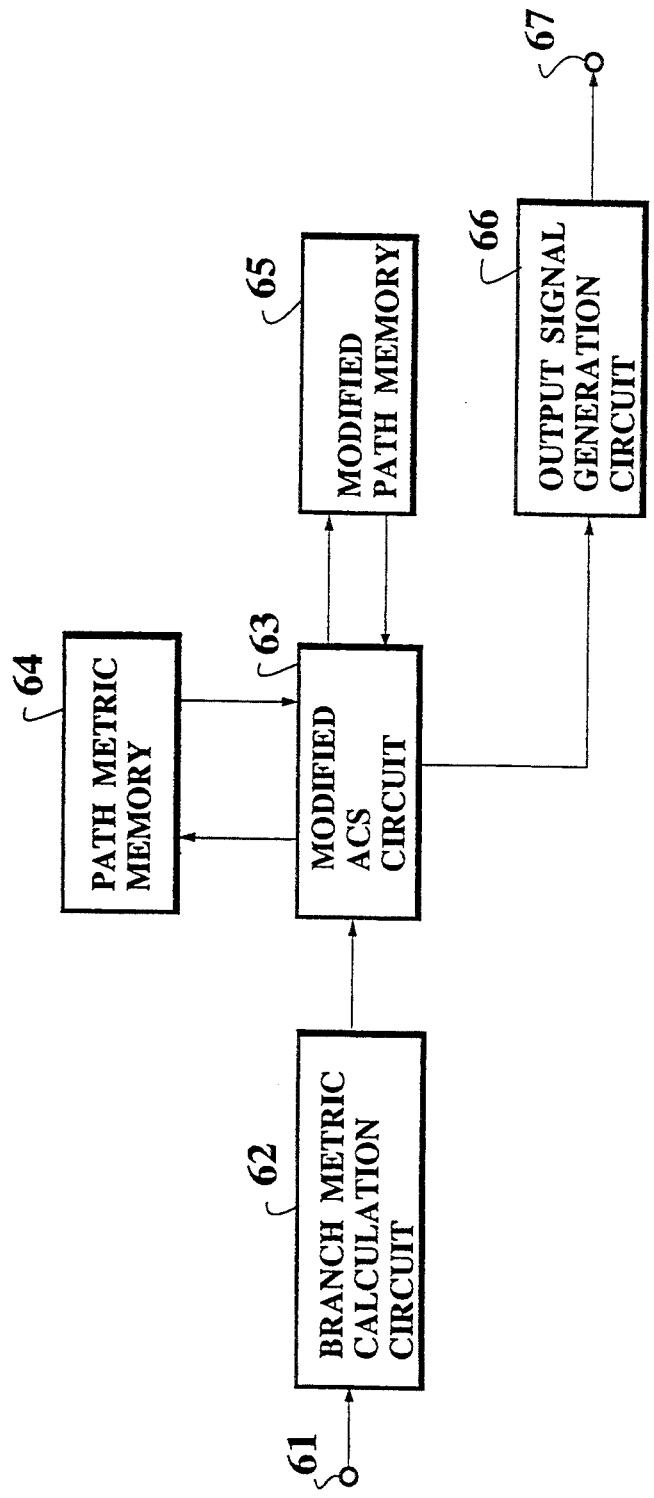
FIG. 11 is a schematic block diagram of a first embodiment of a Viterbi decoder according to the present invention.

Referring now to FIG. 11, a first embodiment of a Viterbi decoder according to the present invention will be described in detail.

A Viterbi decoder of this first embodiment has a configuration as shown in FIG. 11, which comprises: an input terminal 61 for receiving input signals; a branch metric calculation circuit 62 for calculating a branch metric indicating the likelihood of each branch in the trellis (the correlation of each branch with the input signals), for each branch; a modified ACS (Add-Compare-Select) circuit 63 for calculating a path metric which is given by a cumulative total of the branch metrics in each path, and selecting a survivor path which is the maximum likelihood path among the paths by which the transition to each state can be made, for each state, and outputting an oldest bit of each survivor path selected; a path metric memory 64 for storing the path metrics for all of the survivor paths at the previous stages to be used by the modified ACS circuit 63; a modified path memory 65 for storing all of the survivor paths selected by the modified ACS circuit 63 at the previous stage; an output signal generation circuit 66 for determining one bit output signal from the oldest bits of the survivor paths outputted by the modified ACS circuit 63; and an output terminal 67 for outputting the one bit output signal determined by the output signal generation circuit 66 as a decoded signal.

In selecting the survivor path by calculating the path metric, the modified ACS circuit 63 functions substantially similarly to a conventional ACS circuit. For example, for the trellis diagram of FIG. 4 described above, in order to select the maximum likelihood path by which the transition to the state $S_0$ can be made at the (t−1)-th stage, the modified ACS circuit 63 compares a value obtained by adding the path metric of the state $S_0$ at the (t−2)-th stage and the branch metric of the branch 101 with a value obtained by adding the path metric of the state $S_1$ at the (t−2)-th stage and the branch metric of the branch 103, and selects the path corresponding to the larger (or smaller) one of these values.

When all the survivor paths are merging, all of $2^m$ of the oldest bits of the selected survivor paths are equal to the same value, and this value can be taken for the one bit output signal, but in a case all of these $2^m$ oldest bits are not identical, a determination of the one bit output signal is made by using an appropriate determination procedure such as a selection of the majority among $2^m$ bits, or a selection of the bit corresponding to the larger path metric.

The path metrics at the previous stage stored in the path metric memory 64 are read out from the path metric memory 64 to the modified ACS circuit 63 at each stage, and then updated whenever new path metrics are obtained at the modified ACS circuit 63.

Also, in a case of the example described above, the survivor paths for the states $S_0$ and $S_1$ at the (t−2)-th stage are read out from the modified path memory 65 to the modified ACS circuit 63, in order to make the selection of the maximum likelihood path. The paths stored in the modified path memory 65 are updated by the modified ACS circuit 63 in such a manner that the remaining bits of each selected survivor path other than the oldest bit are written into the modified path memory 65 along with one bit indicative of the state to which the transition has been made.

Here, the one bit to be added to the remaining bits of the survivor path does not indicate from which one of the two states the transition has been made as in a conventional Viterbi decoder, so that it is unrelated to the selection of the maximum likelihood path.

This one bit is preferably the bit identical to an input in an encoder which caused each transition at the time of the encoding. For example, in this trellis diagram of FIG. 4, the transitions to the states $S_0$ and $S_1$ are caused only by the new input of "0" to an encoder so that the one bit to be added for the survivor paths making the transitions to the states $S_0$ and $S_1$ is set to be "0", while the transitions to the states $S_2$ and $S_3$ are caused only by the new input of "1" to an encoder so that the one bit to be added for the survivor paths making the transitions to the states $S_2$ and $S_3$ is set to be "1".

Figure 4:
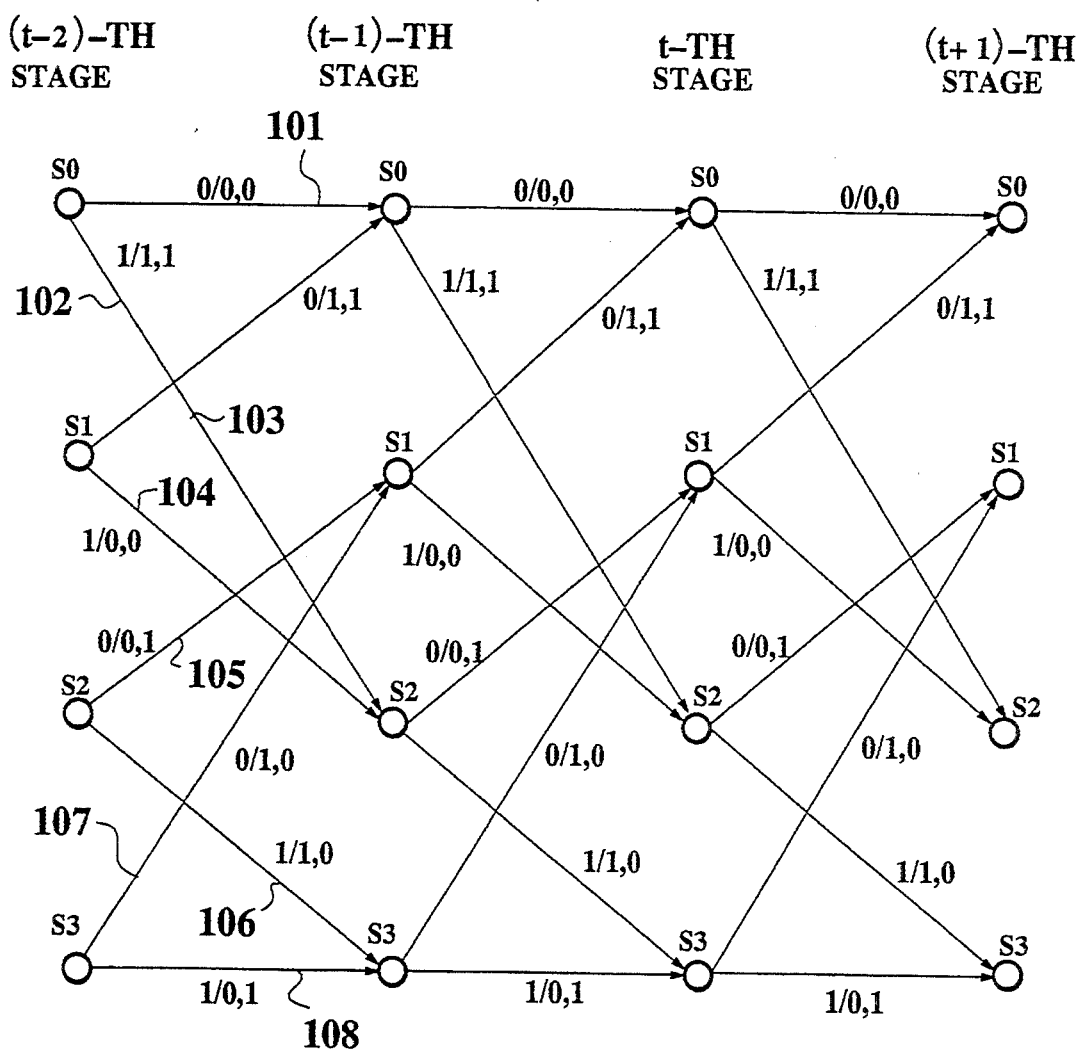
FIG. 4 is a trellis diagram for the states in the convolutional encoder of FIG. 2.
Figure 5:
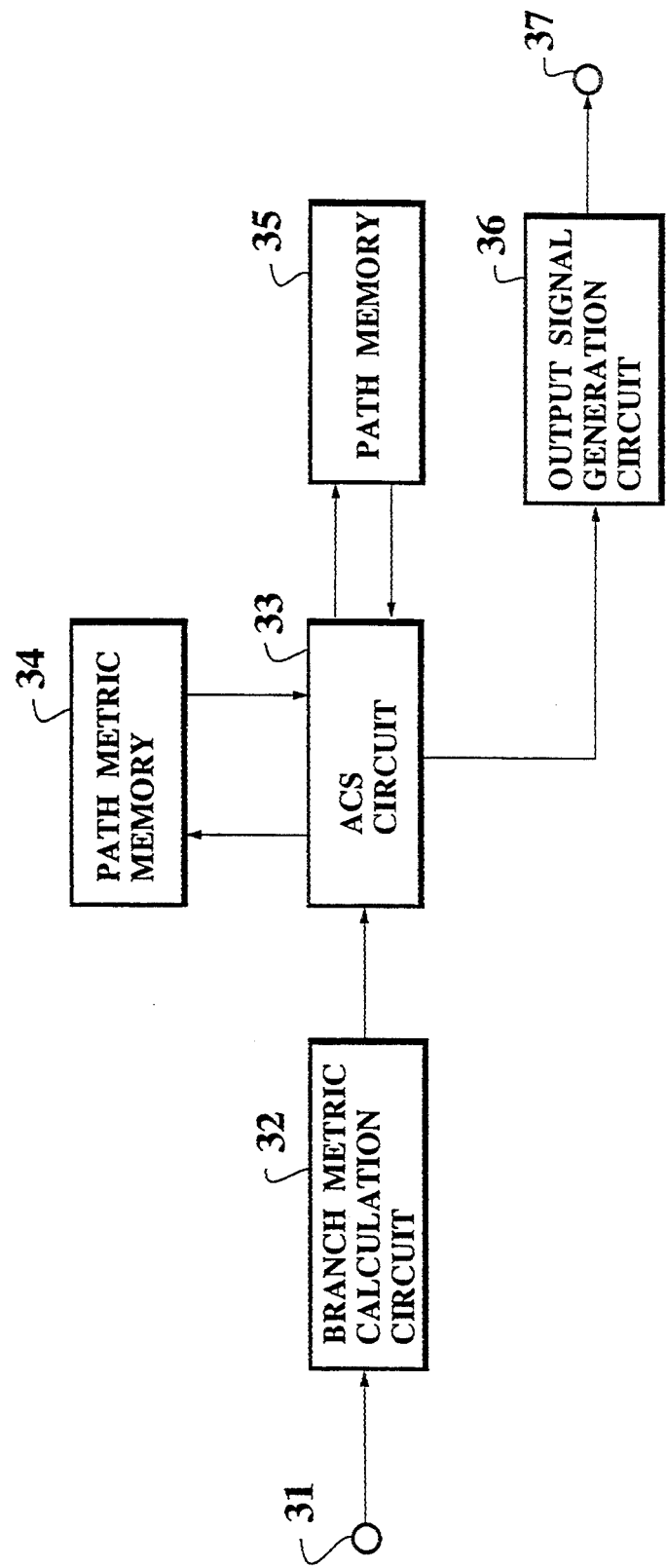
FIG. 5 is a schematic block diagram of a conventional Viterbi decoder.
Figure 6:
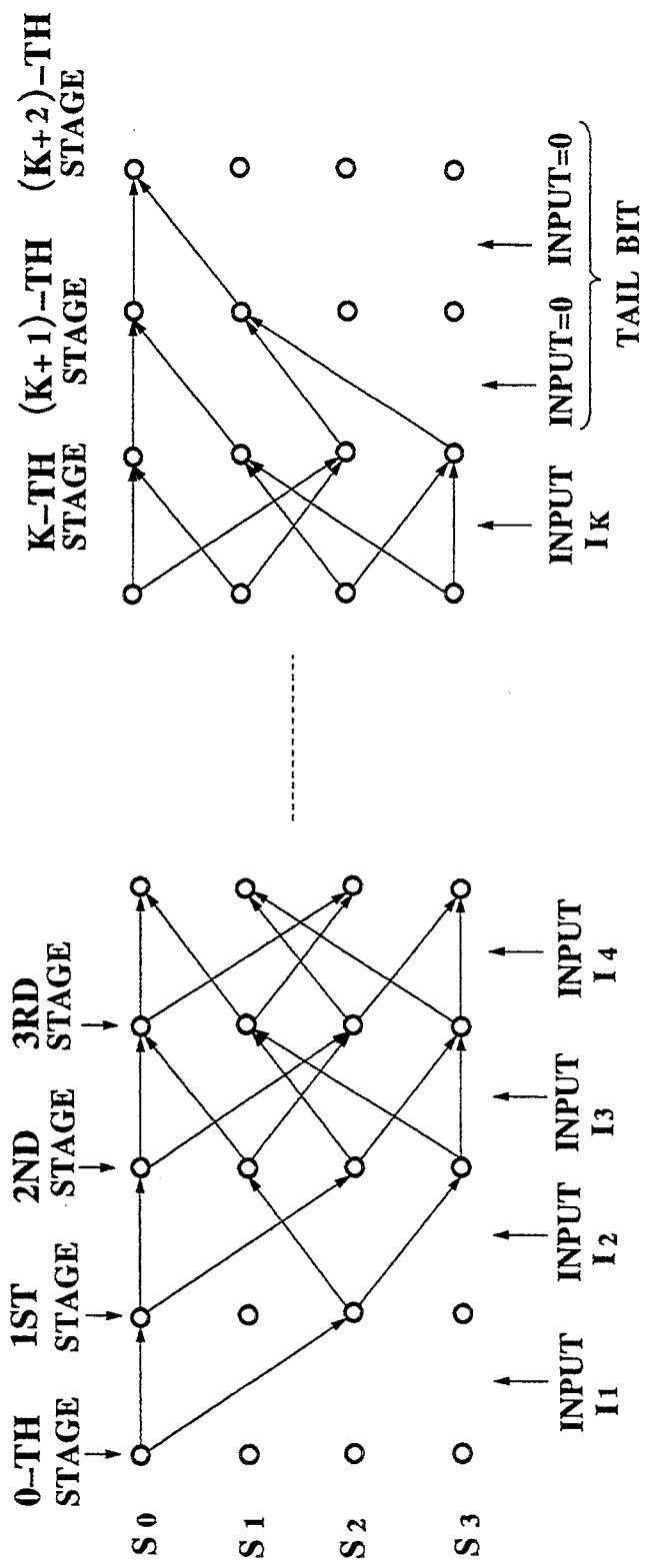
FIG. 6 is a trellis diagram for one conventional decoding method using the predetermined initial and final states.
Figure 7:
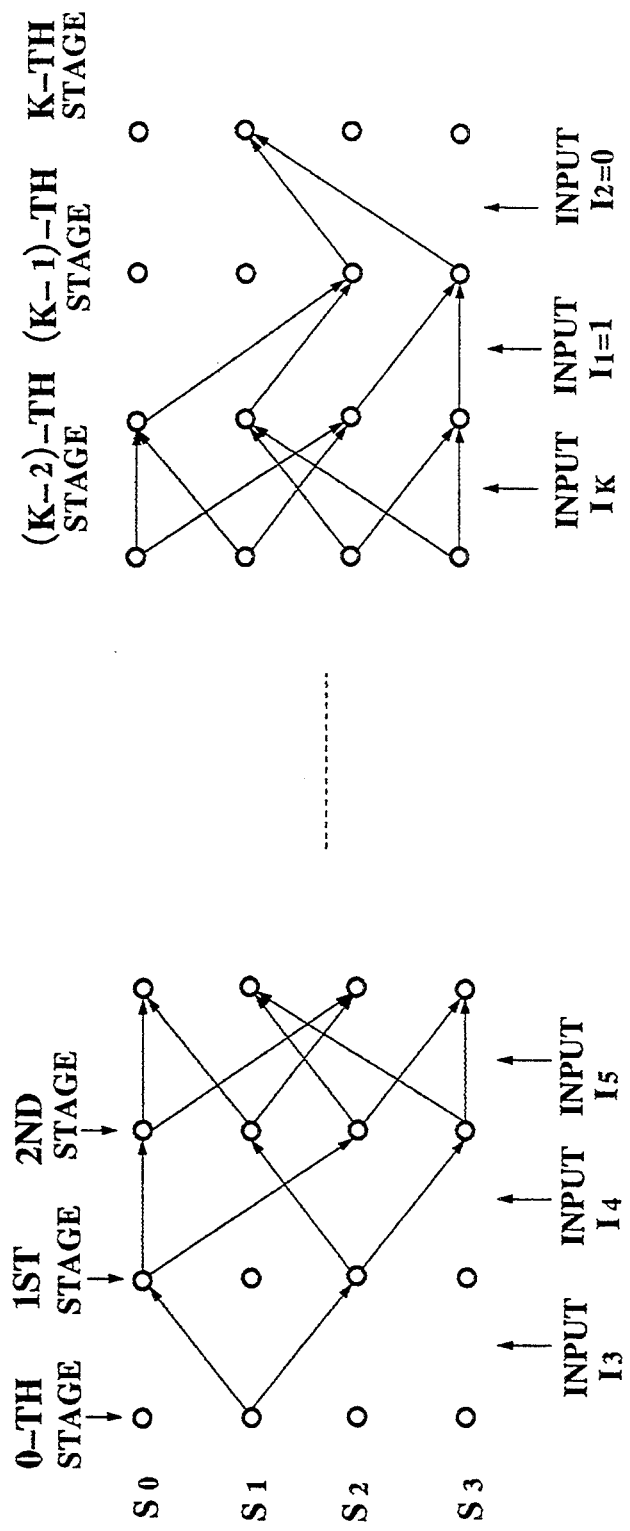
FIG. 7 is a trellis diagram for another conventional decoding method in which the initial and final states are determined according to first m bits of the data.

Alternatively, although less preferable, in the example of the trellis diagram of FIG. 4, this one bit may be the bit identical to a previous input in an encoder of the input which caused each transition at the time of the encoding. For example, in the trellis diagram of FIG. 4, the transitions to the states $S_0$ and $S_2$ are caused when there is the previous input of "0" to an encoder before the bit which caused the transition so that the one bit to be added for the survivor paths making the transitions to the states $S_0$ and $S_2$ may be set to be "0", while the transitions to the states $S_1$ and $S_3$ are caused only when there is the previous input of "1" to an encoder before the bit which caused the transition so that the one bit to be added for the survivor paths making the transitions to the states $S_1$ and $S_3$ may be set to be "1".

According to this first embodiment of a Viterbi decoder, for the signals encoded by an encoder with the memory length m, the bit identical to a previous input in an encoder up to (m−1) stages prior to the input which caused each transition at the time of the encoding may be used for the one bit to be added for updating the survivor path, in order to achieve an advantage with respect to the conventional Viterbi decoder, because each state is realized by the definitive entries for m shift registers.

The use of the survivor paths updated in such a manner can be justified by noting the fact that, in a conventional Viterbi decoder, the one bit to be added for updating the survivor path indicates from which one of the two states the transition has been made, but such a bit also corresponds to the bit which is discarded from the shift registers of the encoder at the time of the transition as the values stored in the shift registers are also updated at the time of the transition. In other words, the one bit to be added for updating the survivor path in the conventional Viterbi decoder has been the bit that has been stored in the last shift register of the encoder prior to the occurrence of the transition. That is to say that, in the conventional Viterbi decoder, the one bit to be added for updating the survivor path has been the oldest bit which can be considered indicative of the state to which the transition has been made, because it is the bit identical to a previous input in an encoder up to m stages prior to the input which caused each transition at the time of the encoding. However, since the shift registers in the encoder are sequentially updated in the course of the encoding, so that the new input will be stored in the last shift register after m stages. In other words, the survivor path updated in the manner of this first embodiment of a Viterbi decoder is identical to the survivor path in the conventional Viterbi decoder displaced by a predetermined number of stages. Consequently, it is possible in this first embodiment of a Viterbi decoder to make the selection of the maximum likelihood path just as in the conventional Viterbi decoder.

Figure 12:
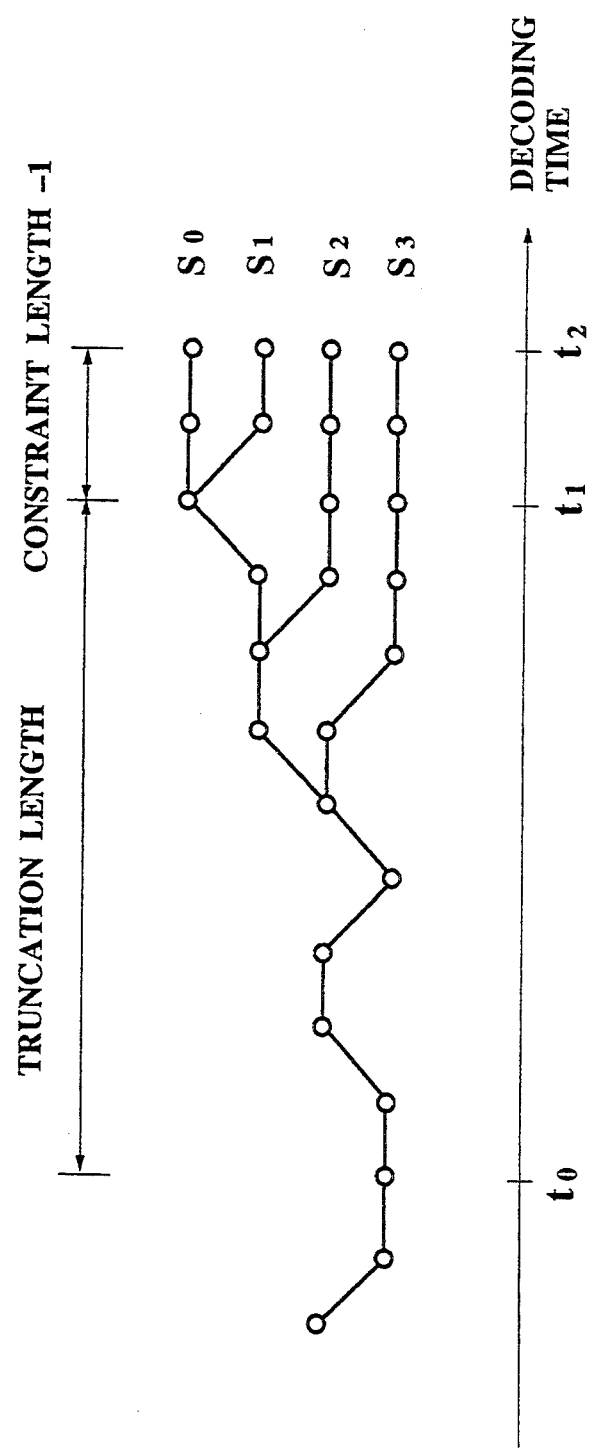
FIG. 12 is a schematic trellis diagram for explaining the operation of the Viterbi decoder of FIG. 11.

Now, for this very reason described above, in the conventional Viterbi decoder, the decoded data has been delayed by the decoding delay time equal to (truncation length + constraint length −1) in the conventional Viterbi decoder. Thus, in the trellis shown in FIG. 12 which shows the survivor paths alone, the decoding delay time in the conventional Viterbi decoder is a period between a time $t_0$ to $t_2$.

Figure 1:
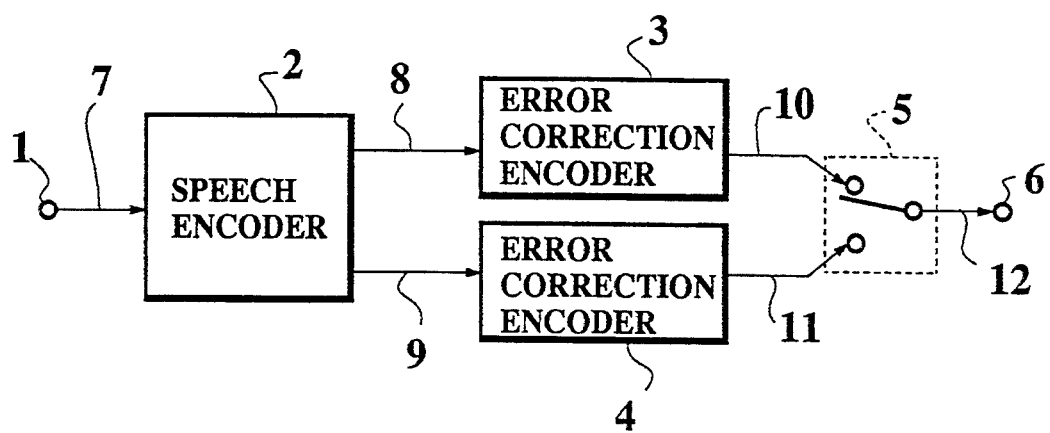
FIG. 1 is a schematic block diagram of a conventional apparatus for carrying out the convolutional encoding of the convolutional codes as the error correction codes.
Figure 2:
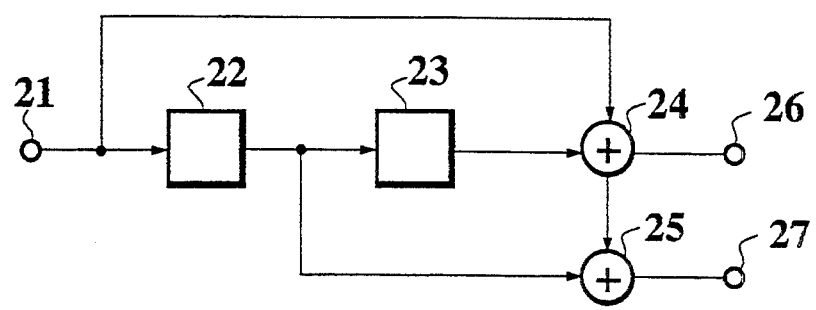
FIG. 2 is a schematic block diagram of a conventional convolutional encoder.
Figure 3:
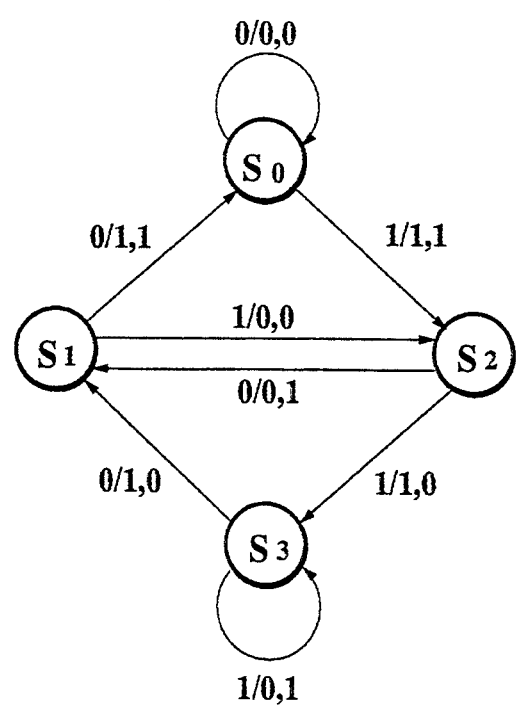
FIG. 3 is a state transition diagram for the states in the convolutional encoder of FIG. 2.

On the other hand, in this first embodiment of a Viterbi decoder, when the bit identical to an input in an encoder which caused each transition at the time of the encoding is used as the one bit for updating the survivor path, the decoding delay time is reduced to a period between a time $t_0$ to $t_1$ in the trellis shown in FIG. 1, i.e., equal to the truncation length.

In other words, according to this first embodiment of a Viterbi decoder, the decoding delay time can be made shorter by up to (truncation length −1) compared with the conventional Viterbi decoder. Note here that the decoding error rate is unaffected by this shortening of the decoding delay time because the truncation length is a predetermined constant which is unchanged.

Thus, according to this first embodiment of a Viterbi decoder, it is possible to provide a method and an apparatus of Viterbi decoding of the convolutional codes capable of reducing the decoding delay time without deteriorating the decoding error rate.

Figure 13:
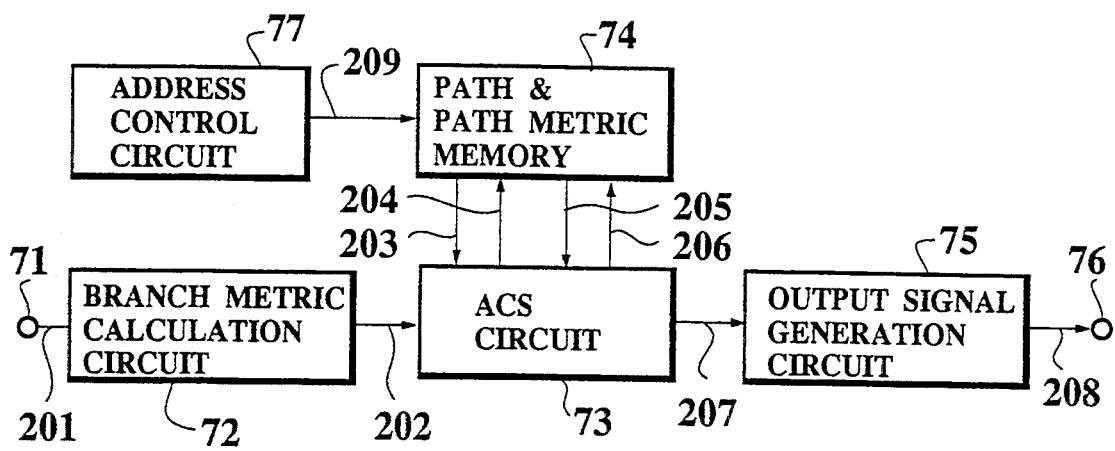
FIG. 13 is a schematic block diagram of a second embodiment of a Viterbi decoder according to the present invention.

Referring now to FIG. 13, a second embodiment of a Viterbi decoder according to the present invention will be described in detail.

A Viterbi decoder of this second embodiment has a configuration as shown in FIG. 13, which comprises: an input terminal 71 for receiving input signals 201 for which either a soft decision or a hard decision has been made; a branch metric calculation circuit 72 for calculating a branch metric 202 indicating the likelihood of each branch in the trellis (the correlation of each branch with the input signals), for each branch; an ACS (Add-Compare-Select) circuit 73 for calculating a path metric which is given by a cumulative total of the branch metrics 202 in each path calculated by the branch metric calculation circuit 72, and selecting a survivor path which is the maximum likelihood path among the paths by which the transition to each state can be made, for each state, and outputting an oldest bit 207 of each survivor path selected; a path and path metric memory 74 for storing the path metrics 203 for all of the survivor paths at the previous stages to be used by the ACS circuit 73, which is to be updated by new path metrics 204 calculated by the ACS 73, and for storing all of the survivor paths 205 selected by the ACS circuit 73 at the previous stage, which is to be updated by new paths 206 selected by the ACS circuit 73; an output signal generation circuit 75 for determining one bit output signal 208 from the oldest bits 207 of the survivor paths outputted by the ACS circuit 73; an output terminal 76 for outputting the one bit output signal 208 determined by the output signal generation circuit 75 as a decoded signal; and an address control circuit 77 for controlling the path and path metric memory 74 by using address signals 209.

In selecting the survivor path by calculating the path metric, the ACS circuit 73 functions substantially similarly to a conventional ACS circuit. For example, for the trellis diagram of FIG. 4 described above, in order to select the maximum likelihood path by which the transition to the state $S_0$ can be made at the $(t-1)$-th stage, the ACS circuit 73 compares a value obtained by adding the path metric of the state $S_0$ at the $(t-2)$-th stage and the branch metric of the branch 101 with a value obtained by adding the path metric of the state $S_1$ at the $(t-2)$-th stage and the branch metric of the branch 103, and selects the path corresponding to the larger (or smaller) one of these values.

When all the survivor paths are merging, all of $2^m$ of the oldest bits of the selected survivor paths are equal to the same value, and this value can be taken for the one bit output signal, but in a case all of these $2^m$ oldest bits are not identical, a determination of the one bit output signal is made by using an appropriate determination procedure such as a selection of the majority among $2^m$ bits, or a selection of the bit corresponding to the larger path metric.

The path metrics 203 at the previous stage stored in the path and path metric memory 74 are read out from the path and path metric memory 74 to the ACS circuit 73 at each stage, and then updated whenever new path metrics 204 are obtained at the ACS circuit 73.

Also, in a case of the example described above, the survivor paths 205 for the states $S_0$ and $S_1$ at the $(t-2)$-th stage are read out from the path and path metric memory 74 to the ACS circuit 73, in order to make the selection of the maximum likelihood path. The paths 205 stored in the path and path metric memory 74 are updated by the ACS circuit 73 in such a manner that the remaining bits of each selected survivor path other than the oldest bit are written into the path and path metric memory 74 along with one bit indicative of the transition that has been made.

Here, the timing for the updating of the path metrics in the path and path metric memory 74 by the new path metrics 204 and the timing for the updating of the path in the path and path metric memory 74 by new paths 206 are set to be the same.

In this second embodiment of a Viterbi decoder, the path and path metric memory 74 is constructed by a RAM controlled by the address signals 209 outputted by the address control circuit 77. When the memory length of the convolutional codes used is m, the truncation length in the Viterbi decoder is L (which is usually four to five times the constraint length), and a number of bits in each path metric is N, the path and path metric memory 74 has a capacity equal to $2^m$ words$\times$(L+N) bits. For example, for the codes using the memory length m equal to 6 (i.e., the constraint length equal to 7), setting the truncation length to be four times as long as the constraint length (i.e., equal to 28) and the number of bits in each path metric to be eight, the path and path metric memory 74 is required to have a capacity of 64 words$\times$(28+8) bits=2,304 bits. In order to implement this path and path metric memory 74 in a form of an internal RAM of a single LSI chip, only 12,948 gates are required, in contrast to the conventional case of using the separate path memory and path metric memory described above which required 13,634 gates. Thus, in this second embodiment of a Viterbi decoder, it is possible to reduce the circuit size of a memory for storing the survivor paths and their path metrics in the Viterbi decoder.

Figure 14:
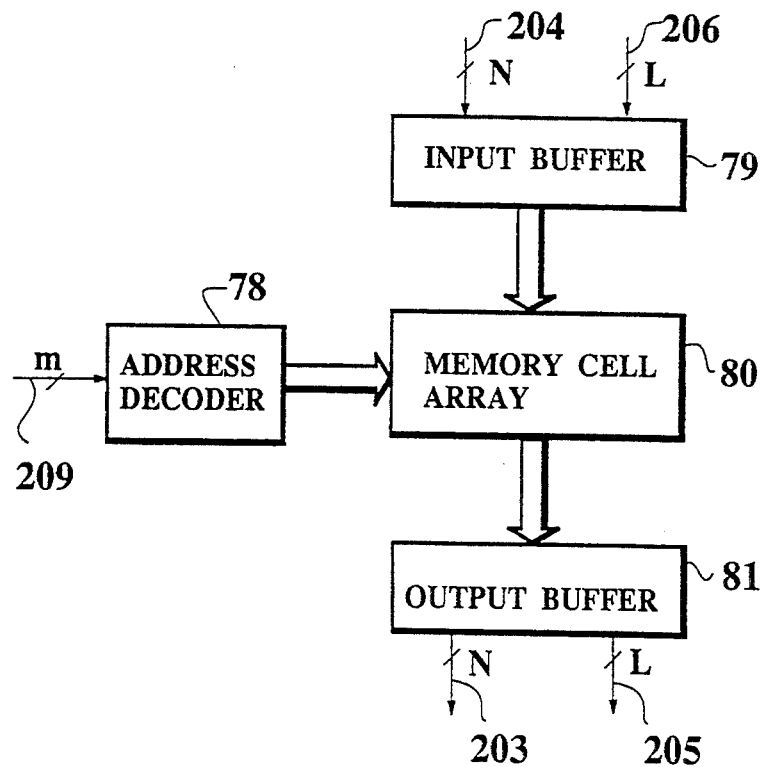
FIG. 14 is a detailed block diagram of an exemplary configuration for a path and path metric memory in the Viterbi decoder of FIG. 13.

An exemplary detail configuration for the path and path metric memory 74 is shown in FIG. 14, which comprises: an address decoder 78 for decoding m bit address signals 209 outputted by the address control circuit 77; a memory cell array 80 for storing $2^m$ words of data, where one word contains (L+N) bits; an input buffer 79 for inputting the updated path metrics 204 and the updated survivor paths 206 obtained by the ACS circuit 73 into the memory cell array 80 at the same timing; and an output buffer 81 for outputting the path metrics 203 and the survivor paths 205 stored in the memory cell array 80 to the ACS circuit 73 at the same timing.

Figure 15:
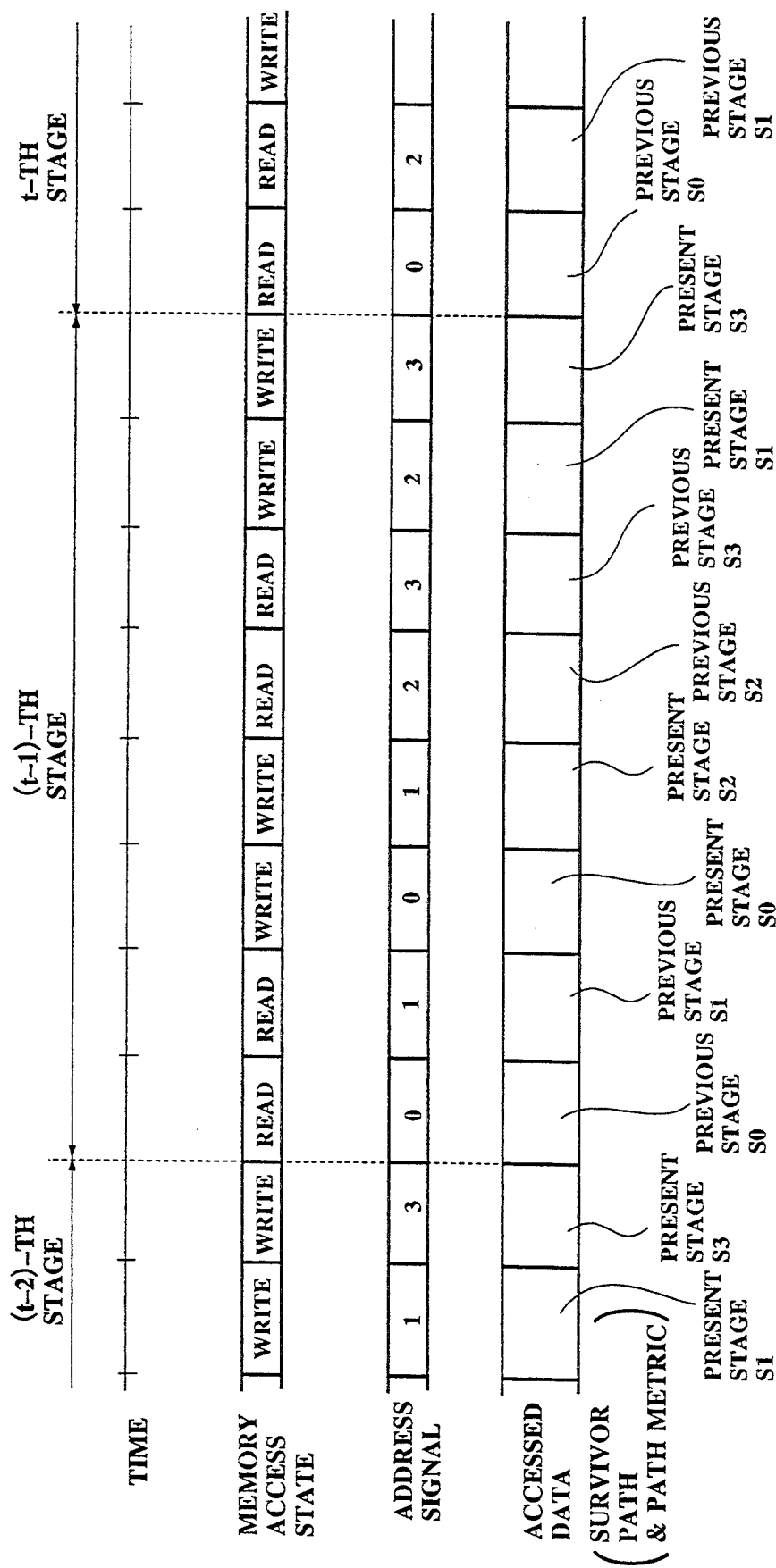
FIG. 15 is a timing chart for an operation of the path and path metric memory in the Viterbi decoder of FIG. 13.

Referring now to the timing chart of FIG. 15, the operation of the path and path metric memory 74 in the Viterbi decoder of this second embodiment will be described in detail, for a case of using the convolutional codes represented by the trellis diagram shown in FIG. 4 descried above. In this case, each decoding stage contains the following 2 (read and write)$\times 2^2$(states)=8 processing timing units.

(1) Reading the survivor path for making the transition to the state $S_0$ at the immediately previous stage and its path metric.

(2) Reading the survivor path for making the transition to the state $S_1$ at the immediately previous stage and its path metric.

(3) Writing the survivor path for making the transition to the state $S_0$ at the present stage and its path metric.

(4) Writing the survivor path for making the transition to the state $S_2$ at the present stage and its path metric.

(5) Reading the survivor path for making the transition to the state $S_2$ at the immediately previous stage and its path metric.

(6) Reading the survivor path for making the transition to the state $S_3$ at the immediately previous stage and its path metric.

(7) Writing the survivor path for making the transition to the state $S_1$ at the present stage and its path metric.

(8) Writing the survivor path for making the transition to the state $S_3$ at the present stage and its path metric.

In these processing timing units, the address control circuit 77 outputs the following address signals to the path and path metric memory 74.

(1) Address of the state $S_0$ of the immediately previous stage.

(2) Address of the state $S_1$ of the immediately previous stage.

(3) Address of the state $S_0$ of the present stage.

(4) Address of the state $S_2$ of the present stage.

(5) Address of the state $S_2$ of the immediately previous stage.

(6) Address of the state $S_3$ of the immediately previous stage.

(7) Address of the state $S_1$ of the present stage.

(8) Address of the state $S_3$ of the present stage.

Here, however, the address of the state $S_0$ of the present stage is set to be the same as the address of the state $S_0$ of the immediately previous stage, the address of the state $S_2$ of the present stage is set to be the same as the address of the state $S_1$ of the immediately previous stage, the address of the state $S_1$ of the present stage is set to be the same as the address of the state $S_2$ of the immediately previous stage, and the address of the state $S_3$ of the present stage is set to be the same as the address of the state $S_3$ of the immediately previous stage.

In addition, in this second embodiment of a Viterbi decoder, the internal operation frequency of the Viterbi decoder is $2\times 2^m$ times the data transmission speed, so that the ACS circuit 73 can be used in the time division multiple access mode, and therefore the circuit size of the ACS circuit 73 can also be reduced.

Thus, according to this second embodiment of a Viterbi decoder, it becomes possible to provide a Viterbi decoder with a reduced circuit size, as a memory for storing the survivor paths and their path metrics is constructed in a form of a single RAM with an address decoder common to both the survivor paths and the path metrics and the updating of the survivor paths and the updating of the path metrics are carried out at the same timing.

Figure 16:
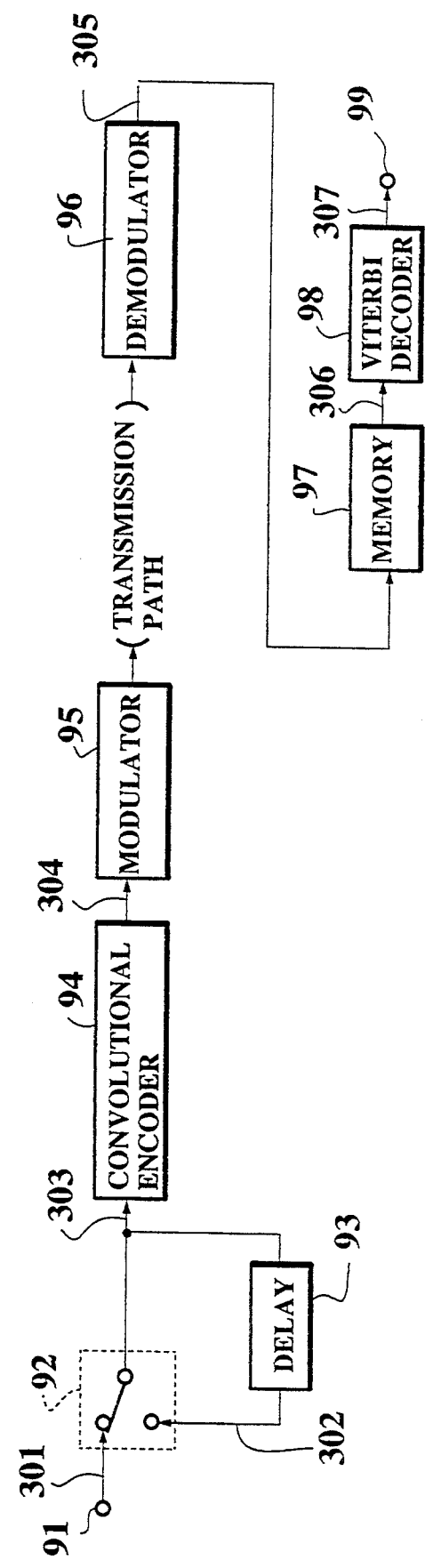
FIG. 16 is a schematic block diagram of a first embodiment of a communication system for encoding and decoding the convolutional codes according to the present invention.

Referring now to FIG. 16, a first embodiment of a communication system for encoding and decoding the convolutional codes according to the present invention will be described in detail.

The communication system of this first embodiment comprises: an input terminal 91 for receiving input data block signals 301; a switch 92 for producing rearranged encoder input signals 303 from the input data block signals 301; a delay 93 for delaying first m bits 302 of the input data block signals 301; a convolutional encoder 94 for applying a convolutional encoding to the rearranged encoder input signals 303; a modulator 95 for modulating encoded output signals 304 obtained by the convolutional encoder 94 to be transmitted through a transmission path; a demodulator 96 for demodulating the encoded output signals 304 of the convolutional encoder 94 modulated by the modulator 95 and transmitted through the transmission path, to obtain received signals 305; a memory 97 for storing the received signals 305 and outputting them in an rearranged order as decoder input signals 306; a Viterbi decoder 98 for decoding the decoder input signals 306 to obtain decoded output signals 307; and an output terminal 99 for outputting the decoded output signals 307 obtained by the Viterbi decoder 98.

In this communication system of FIG. 16, on the transmitter side, the input data block signals 301 contains K bits of data ($I_1, I_2, \ldots, I_K$). The switch 92 is initially connected to the input terminal 91 side to transmit all the input data block signals 301 to the convolutional encoder 94, of which only the first m bits ($I_1, I_2,$ ..., $I_m$) are also supplied to the delay 93. The delay 93 delays the first m bits 302 of the input data block signal 301 until all K bits of the input data block signals 301 are transmitted through the switch 92. After transmitting all K bits of the input data block signals 301, the switch 92 is switched to the delay 93 side, such that the first m bits 302 delayed by the delay 93 are transmitted to the convolutional encoder 94 following the entire input data block signals 301. Consequently, the encoder input signals 303 contains K+m bits of data ($I_1, I_2, \ldots, I_K; I_1, I_2, \ldots, I_m$), with the first m bits appearing twice at the beginning and at the end.

As these K+m bits of the encoder input signals 303 are entered into the convolutional encoder 94, m of shift registers provided in the convolutional encoder 94 are simply filled by the first m bits of the encoder input signals 303 first without producing an output. Then, as the remaining K bits of the encoder input signals 303 after the m-th bit are entered into the convolutional encoder 94, the corresponding encoded output signals 304 are outputted from the convolutional encoder 94. Here, the encoded output signals 304 contains N bits of data ($C_0, C_1, \ldots, C_{N-1}$).

On the receiver side, the received signals 305 contains N bits of data ($R_0, R_1, \ldots, R_{N-1}$) corresponding to the N bits of the encoded output signals 304. The memory 97 memorizes these N bits of received signals 305, and outputs (i+N+j) bits of the decoder input signals 306 by rearranging the memorized received signals 305 in an order of ($R_{N-i}, R_{N-i+1}, \ldots, R_{N-1}; R_0, R_1, \ldots, R_{N-1}; R_0, R_1, \ldots, R_{j-1}$) where i and j are predetermined positive integers of which i is a number of decoding stages necessary for estimating the initial state and j is a truncation length used in the Viterbi decoder 98. Thus, in the decoder input signals 806, the N bits of the received signals 805 are preceded by the last i bits of the received signals 805 and followed by the first j bits of the received signals 805.

The Viterbi decoder 98 makes an estimation of the final state by carrying out the decoding of the first i bits of the decoder input signals 806. Namely, as the decoding of the first i bits of the decoder input signals 806 are carried out, the path metrics for all the possible final states can be obtained for these i bits which are equal to the last i bits of the received signals 805, such that the final state can be estimated as the state having the largest path metric.

Then, using these path metrics obtained for the first i bits of the decoder input signals 806, the decoding of the remaining bits of the decoder input signals 806 are carried out, with the initial state set equal to the estimated final state. Consequently, the deterioration of the decoding error rate due to the uncertainty of the initial state can be prevented.

In addition, the decoding of the first j bits of the received signals 305 are repeated after the entire received signals 305 are decoded by using the path metrics obtained by the decoding of the entire received signals 305, without fixing the initial state to the estimated final state, such that the decoding error rate can be improved further.

Thus, according to this first embodiment of the communication system, it is possible to provide a decoder of convolutional codes capable of reducing the decoding error rate for the data block encoded by the convolutional encoding.

It is to be noted that in a significant reducing of the decoding error rate can be achieved even in a case of setting j equal to zero in the procedure described above.

It is also to be noted that the procedure described above can be generalized in such a manner that the memory 97 outputs the decoder input signals containing (i+N+j) bits arranged in an order of ($R_{N-i+h(mod\ N)}, R_{N-i+h+1(mod\ N)}, \ldots, R_{N-1+h(mod\ N)}; R_{h(mod\ N)}, R_{h+1(mod\ N)}, \ldots, R_{N-1+h(mod\ N)}; R_{h(mod\ N)}, R_{h+1(mod\ N)}, \ldots, R_{h+j-1(mod\ N)}$), where i is a positive integer, j is a non-negative integer, and h is a positive integer.

Figure 17:
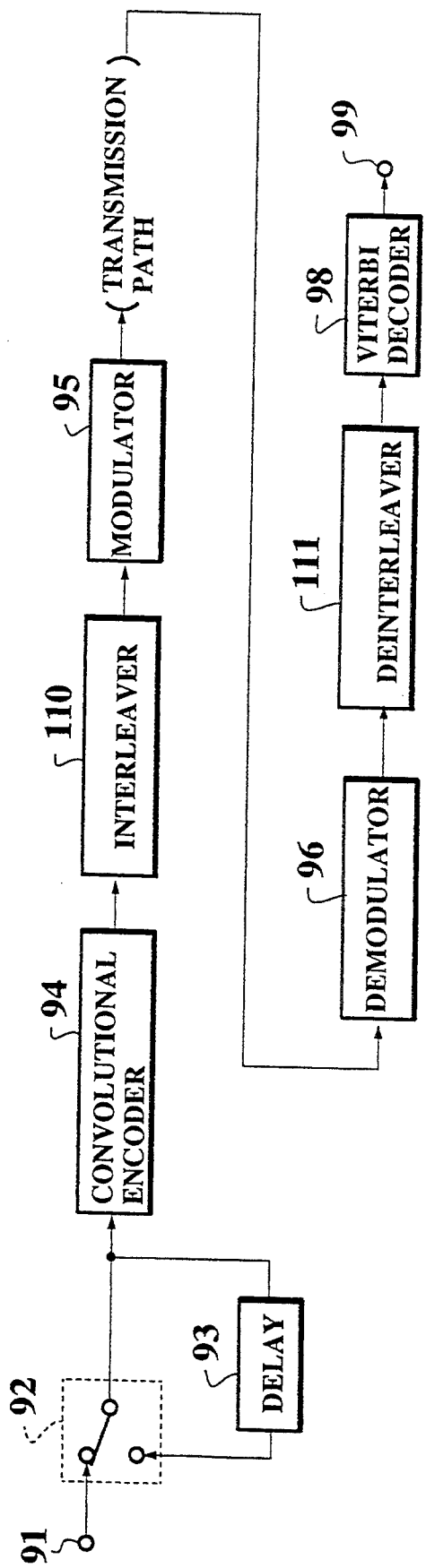
FIG. 17 is a schematic block diagram of a second embodiment of a communication system for encoding and decoding the convolutional codes according to the present invention.

Referring now to FIG. 17, a second embodiment of a communication system for encoding and decoding the convolutional codes according to the present invention will be described in detail. Here, those elements which are equivalent to the corresponding elements in the first embodiment of a communication system shown in FIG. 16 will be given the same reference numerals in the figure and their descriptions will be omitted.

This second embodiment of a communication system differs from the first embodiment of FIG. 16 in that there is provided an interleaver 110 between the convolutional encoder 94 and the modulator 95, so as to interleave the encoded output signals obtained by the convolutional encoder 94 before being modulated at the modulator 95, and that the memory 97 in the first embodiment of FIG. 16 is replaced by a deinterleaver 111 which stores the received signals and outputs the decoder input signals in a manner similar to the memory 97 of the first embodiment of FIG. 16 while also deinterleaving the received signals.

With the incorporation of these interleaver 110 and the deinterleaver 111, the effects similar to those obtained by the first embodiment of FIG. 16 can also be obtained in this second embodiment of a communication system. Here, the deinterleaver 111 has a configuration substantially similar to that of a conventionally known deinterleaver, so that there is hardly any increase of the circuit size in this second embodiment of FIG. 17.

Thus, according to this second embodiment of the communication system, it is possible to provide a decoder of convolutional codes having the interleaving function, which is capable of reducing the decoding error rate for the data block encoded by the convolutional encoding.

It is to be noted here that, in the first and second embodiments of a communication system described above, the decoding error rate characteristic can be improved by taking larger values for i and j, but because the larger values for i and j would increase the amount of calculation required in the decoding as well as the decoding delay time, so that these i and j should be set to appropriate values according to the convolutional codes used.

Figure 18:
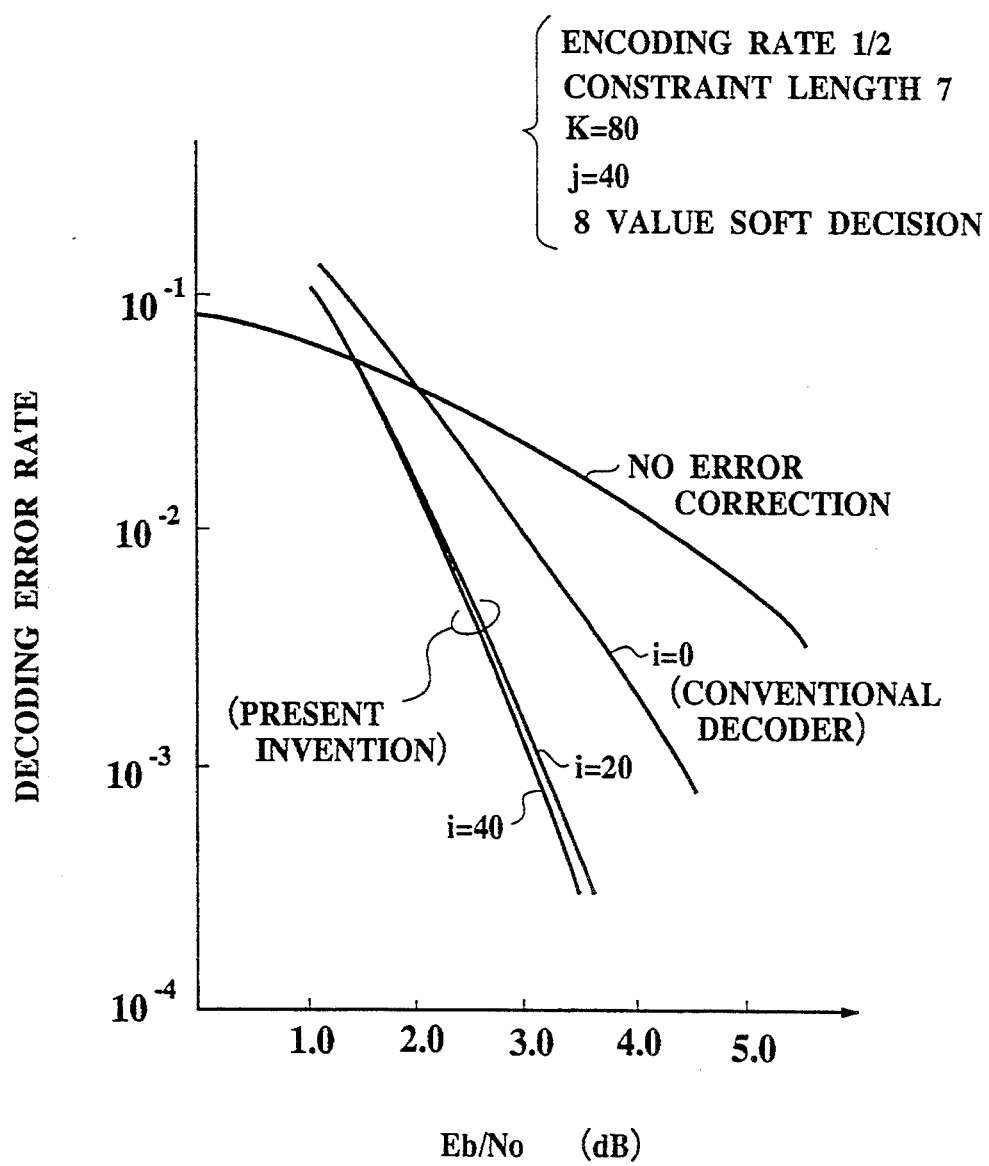
FIG. 18 is a graph of a decoding error rate versus Eb/No for showing the effect of the communication system of FIG. 16.

For example, for three different settings of i=0, 20, and 40 for the number of decoding stages necessary for estimating the initial state, a relationship between the decoding error rate and $E_b/N_o$ in a case of using the convolutional codes with the memory length equal to 6 (i.e., the constraint length equal to 7) and the encoding rate equal to ½ are as shown in a graph of FIG. 18, where a case of i=0 corresponds to a conventional decoding. As can be seen in FIG. 18, the setting of i=20 is quite sufficient for these convolutional codes to achieve the significant improvement in the decoding error rate compared with a conventional case.

As for j, it is a truncation length used in the Viterbi decoder 98, which is usually set equal to four to five times the constraint length for the convolutional codes with the encoding rate equal to $\frac{1}{2}$.

It is also to be noted that the values of i and j may exceed the value of K if desired.

Figure 19:
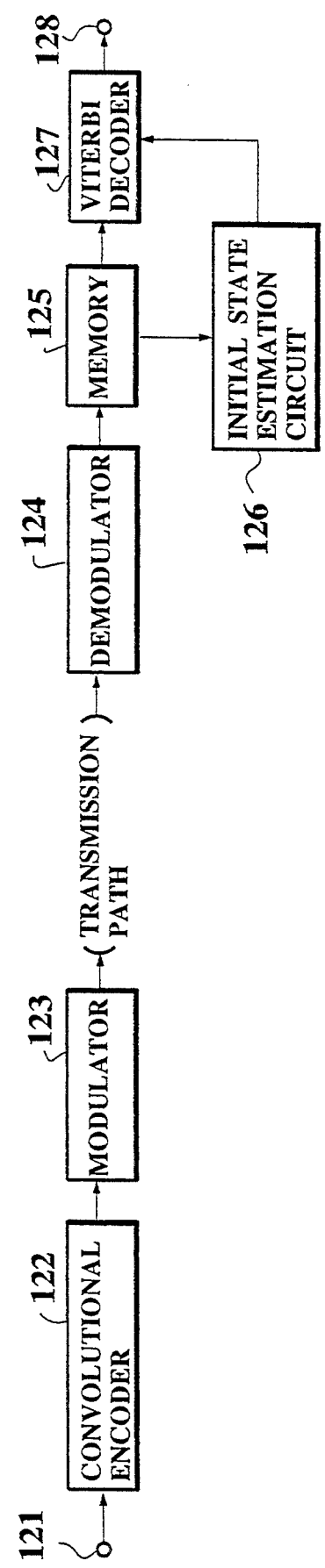
FIG. 19 is a schematic block diagram of a communication system incorporating a first embodiment of a decoding apparatus for decoding the convolutional codes according to the present invention.

Referring now to FIG. 19, a first embodiment of a decoding apparatus for decoding the convolutional codes according to the present invention will be described in detail.

FIG. 19 shows a communication system incorporating the first embodiment of a decoding apparatus, which comprises: an input terminal 121 for inputting input data bit sequences; a convolutional encoder 122 having the memory length equal to m, for applying the convolutional encoding to the input data but sequences to obtain encoded output signals; a modulator 123 for modulating the encoded output signals obtained by the convolutional encoder 122 which are to be transmitted through a transmission path; a demodulator 124 for demodulating the encoded output signals modulated by the modulator 123 and transmitted through the transmission path to obtain received signals; a memory 125 for storing the received signals; an initial state estimation circuit 126 for estimating the most likely initial state in the convolutional encoder 122 according to the received signals stored in the memory 125; a Viterbi decoder 127 for decoding the received signals according to the initial state estimated by the initial state estimation circuit 126; and an output terminal 128 for outputting decoded output signals obtained by the Viterbi decoder 127.

In this first embodiment of FIG. 19, the convolutional encoder 122 is assumed to have an unknown initial state at the start of the convolutional encoding, as unknown m bit data are already present in the m shift registers of the convolutional encoder 122 at the beginning for instance.

The memory 125 supplied a part of a whole of the received signals to the initial state estimation circuit 126. Then, for each of $2^m$ states realizable in the convolutional encoder 122, the initial state estimation circuit 126 calculates the likelihood of each state, i.e., a probability that each state is the initial state. The estimated likelihoods for $2^m$ states are then supplied to the Viterbi decoder 127 as the initial values of the path metrics in the trellis.

Here, the initial state estimation circuit 126 may be realized as follows.

Namely, in a case similar to the first embodiment of a communication system shown in FIG. 16 described above, in which the input data bit sequences entered into the convolutional encoder 122 has K bits, and the convolutional encoder 122 carries out the encoding after the first m bits of the K bits of the input data bit sequences filled the m shift registers, and the encoding of the remaining (K−m) bits of the K bits of the input data bit sequences is followed by the encoding of the first m bits of the K bits of the input data bit sequences, where the encoded output signals of the convolutional encoder 122 has N bits, and the received signals corresponding to these N bits of the encoded output signals are $(R_0, R_1, \ldots, R_{N-1})$, the initial state estimation circuit 126 can be formed from the branch metric calculation circuit and the ACS circuit of the conventionally known Viterbi decoder. In this case, it is sufficient for the memory 125 to supply only a part of the received signals $(R_{N-i}, R_{N-i+1}, R_{N-i+2}, \ldots, R_{N-1})$ to the initial state estimation circuit 126, where i is a predetermined positive integer not greater than N. Here, the probability for estimating the initial state correctly can be increased by using the larger value for i, in which case the reliability of the decoded data can be improved. The path metrics for the survivor paths of all the states calculated by this initial state estimation circuit 126 can represent the likelihoods of these states to be the initial state, so that these path metrics can be supplied directly to the Viterbi decoder 127 as the initial values of the path metrics in the decoding.

Alternatively, the initial state estimation circuit 126 may be realized as follows.

Namely, when the encoded output signals of the convolutional encoder 122 has N bits, and the received signals corresponding to these N bits of the encoded output signals are $(R_0, R_1, \ldots, R_{N-1})$, the memory 125 supplies only a part of the received signals $(R_i, R_{i-1}, \ldots, R_1, R_0)$ in this backward order, where i is a predetermined positive integer. Then, the initial state estimation circuit 126 calculates the path metric for the survivor path of each state by tracing the trellis in a backward direction, starting from the i-th stage toward the 0-th stage. Here, the branch metrics are calculated in a manner similar to the conventional Viterbi decoder, and the maximum likelihood path among a plurality of paths which merge into each state when the trellis is looked in the backward direction is selected as the survivor path for each state. In this calculation, it is preferable to set the path metrics of all of the states to be equal to each other at the i-th stage. Then, the initial state estimation circuit 126 outputs the path metrics for all the states at the 0-th stage after the above described calculation is completed. These path metrics can represent the likelihoods of these states to be the initial state, so that these path metrics can be supplied directly to the Viterbi decoder 127 as the initial values of the path metrics in the decoding.

Figure 20:
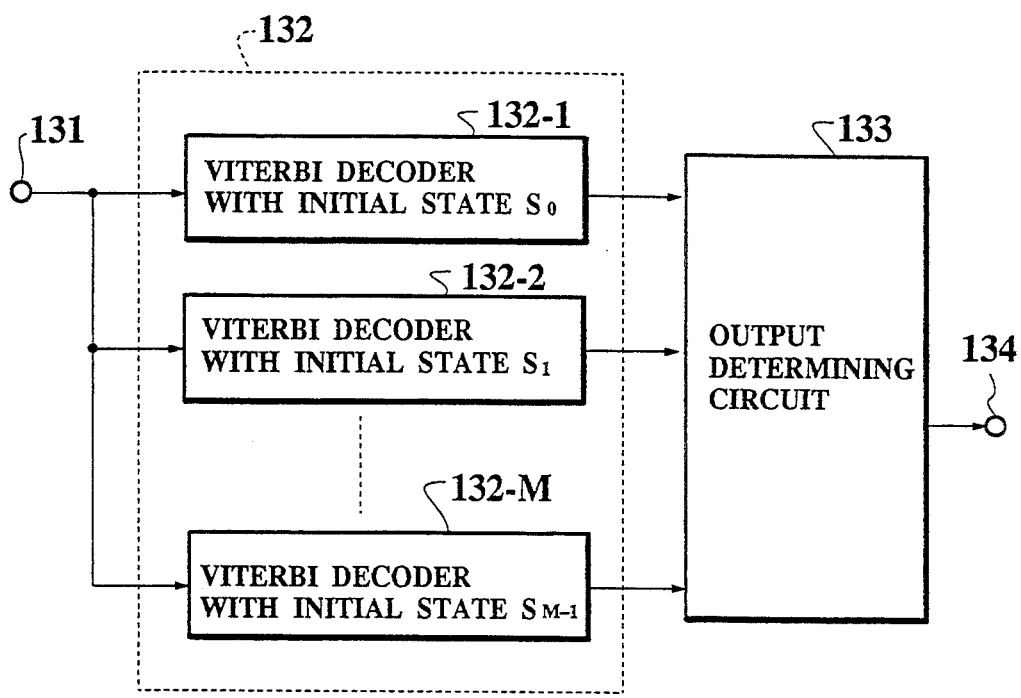
FIG. 20 is a schematic block diagram of a second embodiment of a decoding apparatus for decoding the convolutional codes according to the present invention.

Referring now to FIG. 20, a second embodiment of a decoding apparatus for decoding the convolutional codes according to the present invention will be described in detail.

The decoding apparatus of this second embodiment comprises: an input terminal 131 for receiving demodulated received signals; a Viterbi decoding unit 132 including M Viterbi decoders 132-1 to 132-M, where M is a number of states realizable in a convolutional encoder, which is equal to $2^m$ when the memory length of the convolutional encoder is equal to m, for decoding the received signals; an output determining circuit 133 for determining one decoded output among the outputs of the M Viterbi decoders 132-1 to 132-M in the Viterbi decoding unit 132; and an output terminal 134 for outputting the decoded output determined by the output determining circuit 133.

Here, for the M states $(S_0, S_1, \ldots, S_{m-1})$ which are realizable in the convolutional encoder, the Viterbi decoders 132-1 to 132-M have the initial states set to be $S_0, S_1, \ldots, S_{M-1}$, respectively. In other words, the first Viterbi decoder 132-1 decodes the received signals with the initial state fixed to the state $S_0$, the second Viterbi decoder 132-2 decodes the received signals with the initial state fixed to the state $S_1$, and so on.

Each of the Viterbi decoders 132-1 to 132-M then supplies the decoded output and its likelihood obtained by the decoding of the received signals to the output determining circuit 133, which selects the decoded output of one of the Viterbi decoders 132-1 to 132-M which has obtained the maximum likelihood among the Viterbi decoders 132-1 to 132-M.

It is to be noted that, in a case the received signals have already received an error detection encoding on a transmitting side at a time of encoding, the output determining circuit 133 may selects the decoded output signals according to the number of errors contained in the decoded outputs of the Viterbi decoders 132-1 to 132-M by applying an error detection decoding to the decoded outputs of the Viterbi decoders 132-1 to 132-M, in which case it is not necessary for the Viterbi decoders 132-1 to 132-M to calculate the likelihood and report it to the output determining circuit 133.

Also, in a case the unknown initial state of the convolutional encoder is known to be equal to the final state, the initial state and the final state for the trellis used in each of the Viterbi decoders 132-1 to 132-M should be set to be the same.

Figure 21:
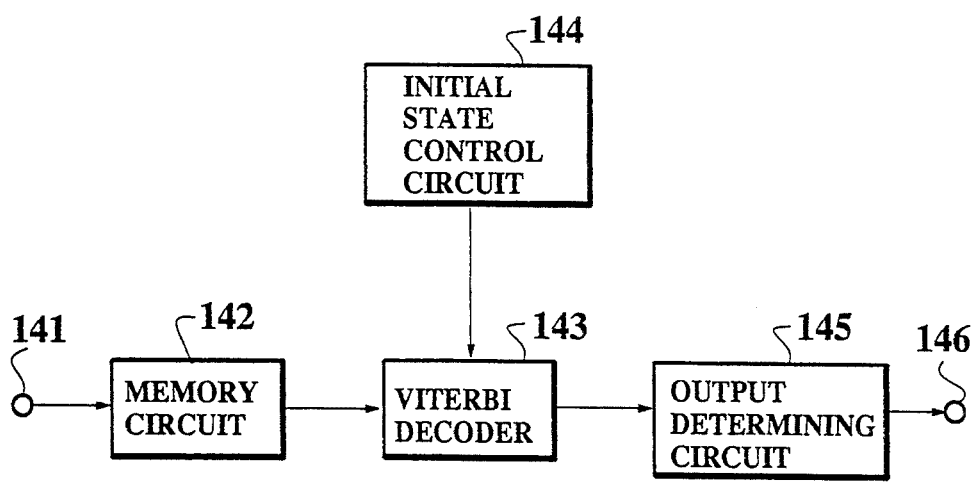
FIG. 21 is a schematic block diagram of a third embodiment of a decoding apparatus for decoding the convolutional codes according to the present invention.

Referring now to FIG. 21, a third embodiment of a decoding apparatus for decoding the convolutional codes according to the present invention will be described in detail.

The decoding apparatus of this third embodiment comprises: an input terminal 141 for receiving demodulated received signals; a memory circuit 142 for memorizing the received signals; a Viterbi decoder 143 for decoding the received signals; an initial state control circuit 144 for controlling a setting of an initial state for the decoding in the Viterbi decoder 143 among all the states realizable in an convolutional decoder; an output determining circuit 145 for determining one decoded output among the outputs of the Viterbi decoder 143 with different settings of the initial state; and an output terminal 146 for outputting the decoded output determined by the output determining circuit 133.

Here, for the M states ($S_0, S_1, \ldots, S_{M-1}$) which are realizable in the convolutional encoder, the initial state control circuit 144 sets the initial state for the decoding in the Viterbi decoder to be each one of the M states $S_0, S_1, \ldots S_{M-1}$, sequentially, and the Viterbi decoder 143 repeats the decoding of the received signals memorized in the memory circuit 142 for M times, with different setting of the initial state each time. In other words, the Viterbi decoder 143 first decodes the received signals with the initial state fixed to the state $S_0$, then decodes the received signals with the initial state fixed to the state $S_1$, and so on.

The Viterbi decoder 143 then supplies the decoded output and its likelihood obtained by the decoding of the received signals at each setting of the initial state to the output determining circuit 145, which selects one of the decoded outputs of the Viterbi decoders 143 corresponding to the maximum likelihood among the M different settings of the initial state.

It is to be noted that, in a case the received signals have already received an error detection encoding on a transmitting side at a time of encoding, the output determining circuit 145 may selects the decoded output signals according to the number of errors contained in the decoded outputs of the Viterbi decoder 143 for different settings of the initial state, by applying an error detection decoding to the decoded outputs of the Viterbi decoder 143 for the different settings of the initial state, in which case it is not necessary for the Viterbi decoder 143 to calculate the likelihood and report it to the output determining circuit 145.

It is also to be noted that it is not always necessary for the Viterbi decoder 143 to carry out the decoding of the received signals for all of the M states realizable in the convolutional encoder. For instance, when the decoded output is determined at the output determining circuit 145 for some setting of the initial state as no error has been detected for that decoded output by the error detecting decoding, the decodings of the received signals at the Viterbi decoder 143 for the remaining settings of the initial state can be cancelled, so as to reduce the amount of unnecessary calculations.

Also, in a case the unknown initial state of the convolutional encoder is known to be equal to the final state, it is necessary to control the final state in the decoding of the Viterbi decoder 143 to be the same as the initial state set by the initial state control circuit 144.

It is to be noted that besides those already mentioned above, many modifications and variations of the above embodiments may be made without departing from the novel and advantageous features of the present invention. Accordingly, all such modifications and variations are intended to be included within the scope of the appended claims.

What is claimed is:

1. An apparatus for error correction encoding using convolutional codes, comprising:
    means for classifying input signals containing a plurality of bits into a plurality of classes according to an error sensitivity of each bit;
    encoder means for applying a convolutional encoding to the input signals classified into said plurality of classes, using an identical encoding rate for all the classes, to obtain encoded signals; and
    puncture means for carrying out a puncture process for puncturing selected bits of the encoded signals, using different puncture rates for the encoded signals corresponding to different ones of said plurality of classes, to obtain error correction encoded output signals in which different classes of the input signals are encoded at different encoding rates according to the error sensitivity of each bit.

2. The apparatus of claim 1, wherein the error correction encoded output signals contains bits corresponding to the different classes of the input signals in an ascending order of the puncture rates used in puncturing the encoded signals corresponding to the different classes of the input signals.

3. The apparatus of claim 1, wherein the error correction encoded output signals contains bits corresponding to the different classes of the input signals in a descending order of the puncture rates used in puncturing the encoded signals corresponding to the different classes of the input signals.

4. A Viterbi decoder for decoding convolutional codes encoded by a convolutional encoder, comprising:
    branch metric calculation means for calculating a branch metric for each state at a present stage of decoding;
    path metric memory means for memorizing a path metric for each state at an immediately previous stage of decoding;
    path memory means for memorizing a survivor path for each state at the immediately previous stage of decoding;
    ACS circuit means for selecting a survivor path for each state at the present stage of decoding, by calculating the path metric for each state at the present stage of decoding from the branch metric calculated by the branch metric calculation means, the path metric memorized in the path metric memory means, and the survivor path memorized in the path memory means, the ACS circuit means outputs an oldest bit of the selected survivor path for each stage at the present stage of decoding, and updates the survivor path memorized in the path memory by remaining bits of the selected survivor path for each state at the present stage of decoding other than the oldest bit to be outputted and an additional bit indicative of said each state to which a transition is made at the present stage of decoding; and output generation means for determining a decoded output according to the oldest bit of the selected survivor path for each state at the present stage of decoding outputted from the ACS circuit means.

5. The Viterbi decoder of claim 4, wherein the additional bit is an encoder input bit which caused the transition to said each state at a time of encoding by the convolutional encoder.

6. A Viterbi decoder for decoding convolutional codes encoded by a convolutional encoder, comprising:
   branch metric calculation means for calculating a branch metric for each state at a present stage of decoding;
   memory means, formed by a single RAM having a memory capacity of $2^m$ words $\times$ (L+N) bits, where m is a memory length of the convolutional encoder, L is a truncation length for each survivor path used in the Viterbi decoder, and N is a number of bits used for expressing each path metric, for memorizing a path metric and a survivor path for each state at an immediately previous stage of decoding together in each word of the memory capacity:
   ACS circuit means for selecting a survivor path for each state at the present stage of decoding, by calculating the path metric for each state at the present stage of decoding from the branch metric calculated by the branch metric calculation means, and the path metric and the survivor path memorized in the memory means, the ACS circuit means outputs an oldest bit of the selected survivor path for each stage at the present stage of decoding; and
   output generation means for determining a decoded output according to the oldest bit of the selected survivor path for each state at the present stage of decoding outputted from the ACS circuit.

7. The Viterbi decoder of claim 6, wherein each stage of decoding includes $2 \times 2^m$ processing timing units for carrying out a reading of the path metric and the survivor path for each state at the immediately previous stage of decoding memorized in the memory means to the ACS circuit means and a writing of the path metric and the survivor path for each state at the present stage of decoding obtained by the ACS circuit means into the memory means.

8. The Viterbi decoder of claim 6, wherein the ACS circuit means also updates the path metric and the survivor path memorized in the memory means simultaneously.

9. A communication system for transmitting data block containing K bits encoded by convolutional codes, comprising:
   a convolutional encoder for applying a convolutional encoding to the data block, in which the convolutional encoding starts from a state in which first m bits of the data block are entered in the convolutional encoder, and the convolutional encoding of remaining (K−m) bits of the data block are followed by the convolutional encoding of the first m bits of the data block, to obtain encoded signals containing N bits;
   memory means for memorizing the N bits of the encoded signals ($R_0, R_1, \ldots, R_{N-1}$), and outputting decoder input signals containing (i+N+j) bits arranged in an order of ($R_{N-i+h(mod\ N)}$, $R_{N-i+h+1(mod\ N)}, \ldots, R_{N-1+h(mod\ N)}$; $R_{h(mod\ N)}$, $R_{h+1(mod\ N)}, \ldots, R_{N-1+h(mod\ N)}$; $R_{h(mod\ N)}$, $R_{h+1(mod\ N)}, R_{h+j-1(mod\ N)}$), where i is a positive integer, j is a non-negative integer, and h is a non-negative integer; and
   a Viterbi decoder for decoding the (i+N+j) bits of the decoder input signals in said order in which the decoder input signals are outputted from the memory means.

10. The communication system of claim 9, wherein the (i+N+j) bits of the decoder input signals comprises first i bits corresponding to last i bits of the encoded signals memorized in the memory means, next N bits corresponding to entire N bits of the encoded signals memorized in the memory means, and last j bits corresponding to first j bits of the encoded signals memorized in the memory means.

11. The communication system of claim 10, wherein the Viterbi decoder obtains a provisional final state by decoding the first i bits of the decoder input signals, and then decodes the next N+j bits of the decoder input signals by setting the provisional final state as an initial state.

12. The communication system of claim 11, wherein i is a number of stages required in the Viterbi decoder to obtain the provisional final state, and j is a truncation length for each survivor path used in the Viterbi decoder.

13. The communication system of claim 9, further comprising an interleaver for interleaving the encoded signals obtained by the convolutional encoder, and wherein the memory means comprises a deinterleaver for deinterleaving the memorized encoded signals before outputting the decoder input signals.

14. A method of transmitting data block containing K bits encoded by convolutional codes, comprising the steps of:
   (a) applying the convolutional encoding to the data block, in which the convolutional encoding starts from a state in which first m bits of the data block are entered in a convolutional encoder, and the convolutional encoding of remaining (K−m) bits of the data block are followed by the convolutional encoding of the first m bits of the data block, to obtain encoded signals containing N bits;
   (b) memorizing the N bits of the encoded signals ($R_0, R_1, \ldots, R_{N-1}$), and outputting decoder input signals containing (i+N+j) bits arranged in an order of ($R_{N-i+h(mod\ N)}$, $R_{N-i+h+1(mod\ N)}, \ldots, R_{N-1+h(mod\ N)}$; $R_{h(mod\ N)}, R_{h+1(mod\ N)}, \ldots, R_{N-1+h(mod\ N)}$; $R_{h(mod\ N)}, R_{h+1(mod\ N)}, \ldots, R_{h+j-1(mod\ N)}$), where i is a positive integer, j is a non-negative integer, and h is a positive integer; and
   (c) decoding the (i+N+j) bits of the decoder input signals in said order in which the decoder input signals are outputted, by a Viterbi decoder.

15. The method of claim 14, further comprising the step of interleaving the encoded signals obtained at the step (a), and wherein at the step (b), the memorized encoded signals are deinterleaved before outputting the decoder input signals.

16. A method of decoding data encoded by a convolutional encoder having a memory length equal to m and capable of taking $2^m$ states; comprising the steps of:
(a) memorizing the data;
(b) calculating a likelihood for each of the $2^m$ states of the convolutional encoder to be an initial state, from at least a part of the data memorized at the step (a); and
(c) decoding the data memorized at the step (a) by using the likelihood for each state to be the initial state calculated at the step (b), by a Viterbi decoder.

17. The method of claim 16, wherein the step (b) further comprises the steps of:
(b1) calculating a branch metric for each state with respect to each of last i bits of the data memorized at the step (a), where i is a positive integer; and
(b2) calculating the path metric for each state with respect to each of the last i bits of the data memorized at the step (a), from the branch metric calculated at the step (b1), and outputting the path metric calculated for each state with respect to a last bit of the last i bits of the data memorized at the step (a) as the likelihood.

18. An apparatus for decoding data encoded by a convolutional encoder capable of taking M states; comprising:
Viterbi decoding means for decoding the data more than once with more than one different settings of an initial state of a trellis to be a different one of the M states of the convolutional encoder, to obtain a plurality off decoded outputs; and
output determining means for selecting one of said plurality of decoded outputs of the Viterbi decoding unit.

19. The apparatus of claim 18, wherein the Viterbi decoding means includes M Viterbi decoders, each of which has the initial state of the trellis set to be one of the M states different from the initial states used in other ones of the M Viterbi decoder.

20. The apparatus of claim 18, wherein the Viterbi decoding means includes:
control means for setting an initial state of the trellis to be each of the M states sequentially; and
a Viterbi decoder for decoding the data, for each setting of the initial state of the trellis set by the control means.

* * * * *